(12) United States Patent
Kwon et al.

(10) Patent No.: US 12,402,460 B2
(45) Date of Patent: Aug. 26, 2025

(54) LIGHT-EMITTING DEVICE AND LIGHT SOURCE MODULE INCLUDING THE SAME

(71) Applicant: SAMSUNG ELECTRONICS CO., LTD., Suwon-si (KR)

(72) Inventors: Yongmin Kwon, Hwaseong-si (KR); Geunwoo Ko, Yongin-si (KR); Jaeyoon Kim, Yongin-si (KR); Jonghyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 629 days.

(21) Appl. No.: 17/327,104

(22) Filed: May 21, 2021

(65) Prior Publication Data

US 2021/0375981 A1    Dec. 2, 2021

(30) Foreign Application Priority Data

May 26, 2020  (KR) .................. 10-2020-0063276

(51) Int. Cl.
*H10H 29/10*    (2025.01)
*H01L 25/16*    (2023.01)
(Continued)

(52) U.S. Cl.
CPC ........... *H10H 29/10* (2025.01); *H01L 25/167* (2013.01); *H10H 20/82* (2025.01);
(Continued)

(58) Field of Classification Search
CPC .... H10H 29/10; H10H 20/82; H10H 20/8312; H10H 20/841; H10H 20/851;
(Continued)

(56) References Cited

U.S. PATENT DOCUMENTS 6,372,608 B1    4/2002    Shimoda et al.
6,645,830 B2    11/2003   Shimoda et al.
(Continued)

FOREIGN PATENT DOCUMENTS

DE    10 2020 134 932 A1    11/2021
DE       102021102035 A1    11/2021
(Continued)

OTHER PUBLICATIONS

Communication dated Nov. 14, 2022 issued by the German Patent and Trademark Office in application No. 16/SS00D48/DE.
(Continued)

*Primary Examiner* — Su C Kim
(74) *Attorney, Agent, or Firm* — Sughrue Mion, PLLC

(57) ABSTRACT

A light source module is provided. The light source module includes a printed circuit board; a light-emitting device mounted on the printed circuit board, the light-emitting device including a plurality of cell blocks, each of which includes a plurality of light-emitting cells; and a plurality of controllers mounted on the printed circuit board, each of which is configured to drive a cell block corresponding thereto, from among the plurality of cell blocks. The plurality of cell blocks are electrically isolated from each other, the plurality of cell blocks include a first cell block and a second cell block, and a number of first light-emitting cells included in the first cell block is less than a number of second light-emitting cells included in the second cell block.

20 Claims, 18 Drawing Sheets

(51) Int. Cl.
*H10H 20/82* (2025.01)
*H10H 20/831* (2025.01)
*H10H 20/841* (2025.01)
*H10H 20/851* (2025.01)
*H10H 20/857* (2025.01)
*H10H 20/858* (2025.01)

(52) U.S. Cl.
CPC ...... *H10H 20/8312* (2025.01); *H10H 20/841* (2025.01); *H10H 20/851* (2025.01); *H10H 20/857* (2025.01); *H10H 20/8582* (2025.01)

(58) Field of Classification Search
CPC ............ H10H 20/857; H10H 20/8582; H10H 29/8421; H10H 29/8508; H10H 29/851; H10H 29/857; H10H 29/8582; H01L 25/167; H01L 25/0753; G09G 3/32
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,188,687 B2 | 5/2012 | Lee et al. | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,964,270 B2 | 5/2018 | Grotsch et al. | |
| 10,151,443 B2 | 12/2018 | Kataoka | |
| 10,386,020 B2 | 8/2019 | Choi et al. | |
| 11,695,031 B2 | 7/2023 | Lee et al. | |
| 2011/0242027 A1* | 10/2011 | Chang | G06F 3/047 345/173 |
| 2012/0105518 A1* | 5/2012 | Kang | G09G 3/3426 345/694 |
| 2016/0343771 A1* | 11/2016 | Bower | G09F 9/33 |
| 2017/0256522 A1* | 9/2017 | Cok | H01L 25/50 |
| 2018/0094799 A1* | 4/2018 | Shan | H01L 33/486 |
| 2019/0170316 A1 | 6/2019 | Okubo | |
| 2019/0326349 A1 | 10/2019 | Kwon et al. | |
| 2020/0011518 A1 | 1/2020 | Ko et al. | |
| 2020/0025351 A1 | 1/2020 | Kwon et al. | |
| 2020/0146119 A1* | 5/2020 | Li | H05B 47/155 |
| 2020/0312832 A1* | 10/2020 | Chi | H10K 59/353 |
| 2021/0362644 A1 | 11/2021 | Kwon et al. | |
| 2021/0367121 A1 | 11/2021 | Kim et al. | |

FOREIGN PATENT DOCUMENTS

| | | |
|---|---|---|
| DE | 102021108228 A1 | 11/2021 |
| KR | 10-2006-0020089 A | 3/2006 |
| KR | 10-2015-0028634 A | 3/2015 |
| KR | 10-2016-0031938 A | 3/2016 |
| WO | 2015091005 A1 | 6/2015 |

OTHER PUBLICATIONS

Communication issued Jan. 23, 2024 by the German Patent Office in German Patent Application No. 10 2021 108 514.4.
Communication dated Nov. 14, 2022 issued by the German Patent and Trademark Office in application No. 102021108514.4.

* cited by examiner

LIGHT-EMITTING DEVICE AND LIGHT SOURCE MODULE INCLUDING THE SAME

CROSS-REFERENCE TO RELATED THE APPLICATION

This application claims priority from Korean Patent Application No. 10-2020-0063276, filed on May 26, 2020, in the Korean Intellectual Property Office, the disclosure of which is incorporated herein by reference in its entirety.

BACKGROUND

1. Field

Apparatuses and methods consistent with example embodiments relate to a light-emitting device and a light source module including the same, and more particularly, to a light-emitting device including a plurality of blocks including a plurality of light-emitting cells, and a light source module including the light-emitting device.

2. Description of the Related Art

Semiconductor light-emitting devices include elements such as light-emitting diodes (LEDs), and are increasingly being used as light sources because the semiconductor light-emitting devices have many advantages such as low power consumption, high brightness, and long lifespans. In recent years, there has been a growing interest in semiconductor light-emitting devices as units capable of replacing the existing halogen or xenon lamps used as light sources for headlamps or tail lamps for vehicles.

When a semiconductor light-emitting device is applied as a light source to a lighting apparatus, it may be necessary to adjust brightness, a light orientation angle, and a light irradiation angle of the semiconductor light-emitting device to desired values. In particular, a headlamp or a tail lamp for a vehicle requires a semiconductor light-emitting device capable of adjusting the brightness of light according to surrounding conditions.

SUMMARY

One or more example embodiments provide a light-emitting device, which has improved optical characteristics and reliability, and a light source module including the light-emitting device.

According to an aspect of an example embodiment, a light source module includes a printed circuit board; a light-emitting device mounted on the printed circuit board, the light-emitting device including a plurality of cell blocks, each of which includes a plurality of light-emitting cells; and a plurality of controllers mounted on the printed circuit board, each of which is configured to drive a cell block corresponding thereto, from among the plurality of cell blocks. The plurality of cell blocks are electrically isolated from each other, the plurality of cell blocks include a first cell block and a second cell block, and a number of first light-emitting cells included in the first cell block is less than a number of second light-emitting cells included in the second cell block.

According to an aspect of an example embodiment, a light-emitting device includes: a plurality of cell blocks electrically isolated from each other, each of which includes a plurality of light-emitting cells; and a plurality of pads configured to electrically connect the plurality of cell blocks to an external device. The plurality of cell blocks include a first cell block and a second cell block, and a number of first light-emitting cells included in the first cell block is less than a number of second light-emitting cells included in the second cell block.

According to an aspect of an example embodiment, a light source module includes: a printed circuit board; a light-emitting device mounted on the printed circuit board, the light-emitting device including a plurality of cell blocks, each of which includes a plurality of light-emitting cells; and a plurality of controllers mounted on the printed circuit board, each of which is configured to drive a cell block corresponding thereto, from among the plurality of cell blocks. The plurality of cell blocks are electrically isolated from each other, and the plurality of cell blocks are arranged in a first row and a second row, and a number of light-emitting cells included in cell blocks arranged in the first row is less than a number of light-emitting cells included in cell blocks arranged in the second row.

BRIEF DESCRIPTION OF THE DRAWINGS

The above and other objects and features will become more apparent from the following description of example embodiments with reference to the accompanying drawings in which.

DETAILED DESCRIPTION

Figure 1:
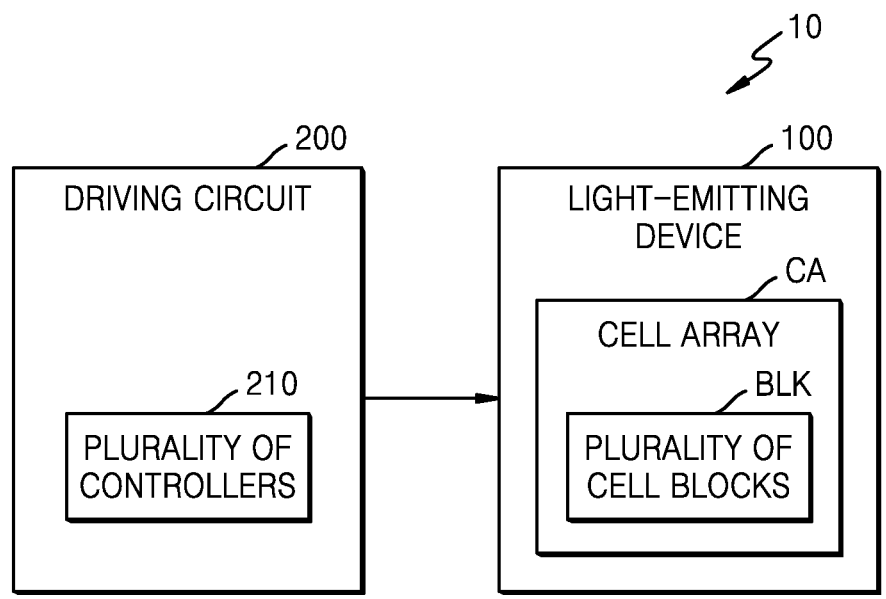
FIG. 1 is a block diagram of a configuration of a light source module according to an example embodiment.

The above and other aspects and features will become more apparent by describing example embodiments in detail with reference to the accompanying drawings. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. The same reference numerals are used to denote the same elements in the drawings, and repeated descriptions thereof will be omitted.

FIG. 1 is a block diagram of a configuration of a light source module 10 according to an example embodiment.

Referring to FIG. 1, the light source module 10 may include a light-emitting device 100 and a driving circuit 200.

The light-emitting device 100 may include a cell array CA including a plurality of light-emitting cells. The cell array CA included in the light-emitting device 100 may include a plurality of cell blocks BLK. In an example embodiment, the plurality of cell blocks BLK may be electrically isolated from each other.

The driving circuit 200 may be connected to a power supply. The power supply may generate an input voltage required for an operation of the light-emitting device 100. In an example embodiment, when the light source module 10 is a headlamp for a vehicle, the power supply may include a battery mounted in the vehicle. In an example embodiment, when the light source module 10 is a household or industrial lighting fixture, the light source module 10 may further include an alternating-current (AC) power supply configured to generate an AC voltage, a rectifying circuit configured to rectify the AC voltage and generate a direct-current (DC) voltage, and a voltage regulating circuit.

The driving circuit 200 may include a plurality of controllers 210. Each of the plurality of controllers 210 may include an integrated circuit (IC).

The plurality of controllers 210 may drive the cell array CA included in the light-emitting device 100. In an example embodiment, each of the controllers 210 may be electrically connected to a corresponding one of the plurality of cell blocks BLK and control operations of light-emitting cells included in the corresponding cell block BLK. In an example embodiment, the number of controllers 210 may be equal to the number of cell blocks BLK included in the light-emitting device 100. However, example embodiments are not limited thereto. For example, the number of controllers 210 may be different from the number of cell blocks BLK.

Figure 2:
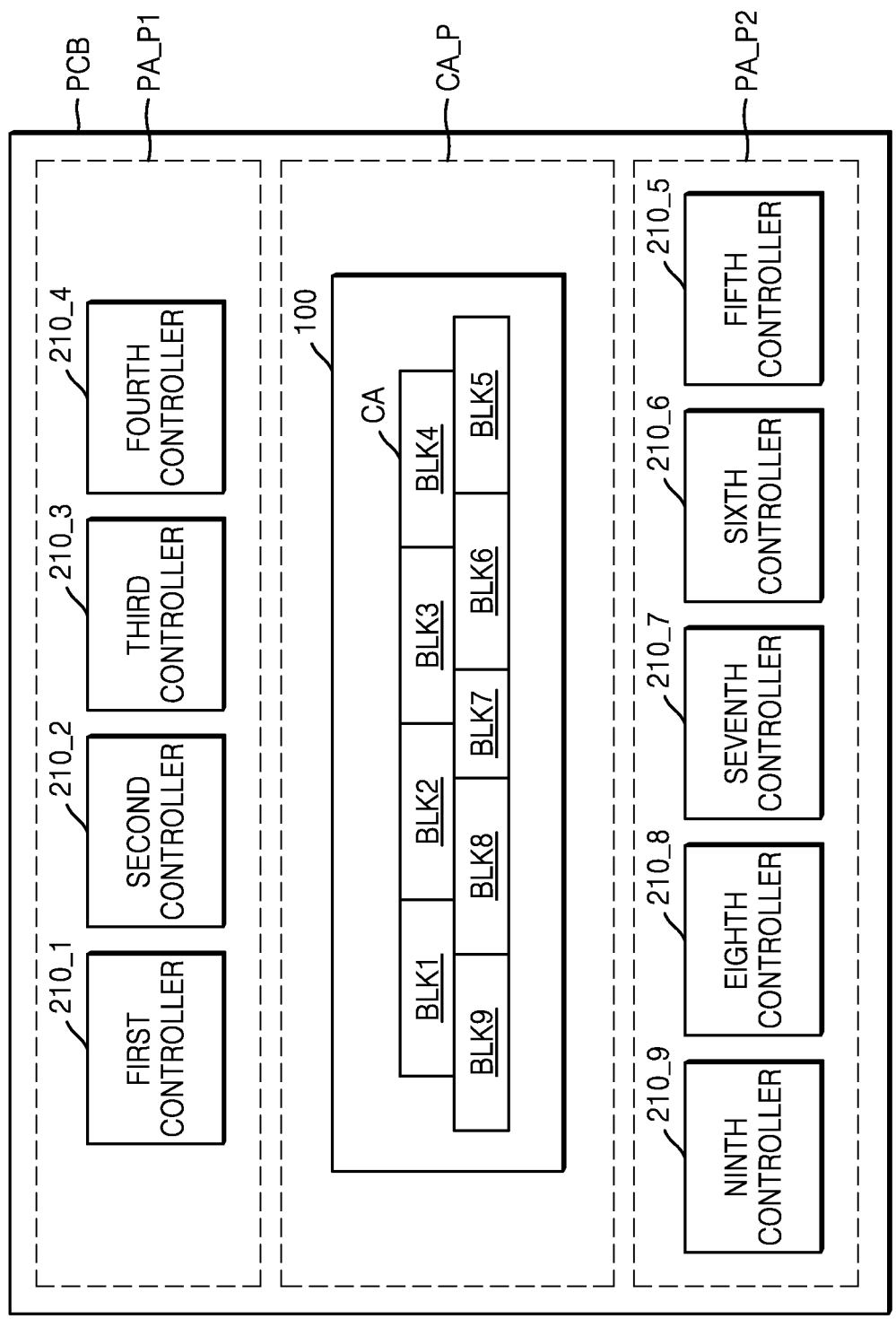
FIG. 2 is a perspective view of a configuration of a light source module according to an example embodiment.

FIG. 2 is a perspective view of a configuration of a light source module 10 according to an example embodiment.

Referring to FIG. 2, the light source module 10 may include a light-emitting device 100 and a plurality of controllers (e.g., first to ninth controllers 210_1 to 210_9), which are mounted on a printed circuit board PCB. In an example embodiment, the light-emitting device 100 may include one chip, and the light source module 10 may include the light-emitting device 100 including one chip.

The light-emitting device 100 may include a cell array CA in which a plurality of light-emitting cells are arranged in a matrix form. The cell array CA may include a plurality of cell blocks (e.g., first to ninth cell blocks BLK1 to BLK9). Although nine cell blocks BLK1 to BLK9 are illustrated in FIG. 2, example embodiments are not limited thereto, and the number and arrangement of cell blocks (e.g., BLK1 to BLK9) may be changed.

The first to ninth cell blocks BLK1 to BLK9 may be electrically isolated from each other. That is, light-emitting cells included in different cell blocks may be electrically isolated from each other.

In an example embodiment, the light-emitting device 100 may have a rectangular shape having shorter sides in a second direction Y than in a first direction X. The first direction X and the second direction Y may be parallel to a main surface of a printed circuit board PCB and perpendicular to each other.

In an example embodiment, in the light-emitting device 100, the first to ninth cell blocks BLK1 to BLK9 may be arranged in a first row and a second row. In this case, each of the first row and the second row may refer to cell blocks arranged in parallel in the first direction X. Because the first to ninth cell blocks BLK1 to BLK9 are arranged in two rows, it may be structurally easy to form a plurality of pads configured to connect the light-emitting device 100 to the first to ninth controllers 210_1 to 210_9.

The light-emitting cells may be arranged in consideration of a light distribution type required for the light source module 10. The number of light-emitting cells included in cell blocks arranged in the first row (e.g., BLK1 to BLK4) may be less than the number of light-emitting cells included in cell blocks arranged in the second row (e.g., BLK5 to BLK9). The number of cell blocks arranged in the first row may be different from the number of cell blocks arranged in the second row. For example, the first to fourth cell blocks BLK1 to BLK4 may be sequentially arranged in the first row in the first direction X, and the fifth to ninth cell blocks BLK5 to BLK9 may be sequentially arranged in the second row in an opposite direction to the first direction X.

In an example embodiment, the number of light-emitting cells included in the first cell block BLK1 arranged at one end of the first row may be less than the number of light-emitting cells included in another one of the first to ninth cell blocks BLK1 to BLK9. For example, the number of light-emitting cells in the first cell block BLK1 may be less than the number of light-emitting cells in the second cell block BLK2, which is adjacent to the first cell block BLK1.

In an example embodiment, the number of light-emitting cells included in the seventh cell block BLK7 in the center of the second row may be less than the number of light-emitting cells included in another one of the first to ninth cell blocks BLK1 to BLK9. For example, the number of light-emitting cells included in the seventh cell block BLK7 may be less than the number of light-emitting cells included in the sixth cell block BLK6, which is adjacent to the seventh cell block BLK7, or be less than the number of light-emitting cells included in the eighth cell block BLK8, which is adjacent to the seventh cell block BLK7.

In the light source module 10, the light-emitting cells may be arranged in consideration of a light distribution type required for the light source module 10. For example, when the light source module 10 is used as a headlamp for a vehicle, it may be relatively unnecessary to irradiate light to an upper outer area in front of a user in a direction in which the user travels. The first cell block BLK1 and the fourth cell block BLK4, which are at both ends of the first row, may include a smaller number of light-emitting cells than other cell blocks, and thus, the light source module 10 may not separately irradiate light to unnecessary areas.

In addition, for example, when the light source module 10 is used as the headlamp for the vehicle, the light source module 10 may need to irradiate light having a relatively high light intensity to a central area of a road in front of the user in the direction in which the user travels. The seventh cell block BLK7 in the center of the second row may include a relatively small number of light-emitting cells. Even when the light source module 10 is controlled to irradiate light having a high intensity by applying a relatively large current to the seventh cell block BLK7, power consumption by the seventh cell block BLK7 may be reduced because the seventh cell block BLK7 includes fewer light-emitting cells.

Each of the first to ninth controllers 210_1 to 210_9 may control light-emitting cells included in a cell block corresponding thereto, from among the first to ninth cell blocks BLK1 to BLK9, to operate. For example, the first controller 210_1 may be electrically connected to the first cell block BLK1 and control an operation of the first cell block BLK1. The second controller 210_2 may be electrically connected to the second cell block BLK2 and control an operation of the second cell block BLK2. The description of the first and second controllers 210_1 and 210_2 may be equally applied to the third to ninth controllers 210_3 to 210_9.

In the light-emitting device 100, the plurality of light-emitting cells in the cell array CA may be subdivided into the first to ninth cell blocks BLK1 to BLK9, and operations of the first to ninth cell blocks BLK1 to BLK9 may be controlled by respectively different controllers. Thus, it may become easy to control a light emitting operation of the light-emitting device 100. The control of brightness of the light-emitting device 100 may be subdivided, and a brightness adjusting speed may be increased.

In an example embodiment, the first to ninth controllers 210_1 to 210_9 may be arranged in an order in which cell blocks corresponding to the first to ninth controllers 210_1 to 210_9 are arranged. For example, in the light-emitting device 100, the first to fourth cell blocks BLK1 to BLK4 may be sequentially arranged in the first direction X, and the first to fourth controllers 210_1 to 210_4 corresponding to the first to fourth cell blocks BLK1 to BLK4 may also be sequentially arranged in the first direction X. Additionally, in the light-emitting device 100, the fifth to ninth cell blocks BLK5 to BLK9 may be sequentially arranged in an opposite direction to the first direction X, and the fifth to ninth controllers 210_5 to 210_9 corresponding to the fifth to ninth cell blocks BLK5 to BLK9 may also be sequentially arranged in the opposite direction to the first direction X. In the light source module 10, the first to ninth controllers 210_1 to 210_9 and the first to ninth cell blocks BLK1 to BLK9 may be arranged such that the order in which the first to ninth controllers 210_1 to 210_9 are arranged corresponds to the order in which the first to ninth cell blocks BLK1 to BLK9. Thus, it may become easy to form wirings or wires configured to electrically connect the first to ninth controllers 210_1 to 210_9 to the first to ninth cell blocks BLK1 to BLK9.

However, the arrangement of the plurality of controllers 210_1 to 210_9 is not limited thereto, and only some of the first to fourth controller 210_1-210_4 may be sequentially arranged in the first direction X, and only some of the fifth to ninth controllers 210_5 to 210_9 may be sequentially arranged in an opposite direction to the first direction X.

In an example embodiment, the number of controllers (e.g., 210_1 to 210_9) may be equal to the number of cell blocks (e.g., BLK1 to BLK9). However, example embodiments are not limited thereto. At least two different controllers may be connected to one cell block and control the one cell block. Alternatively, one controller may control at least two different cell blocks.

The light-emitting device 100 may be mounted on a central area CA_P of the printed circuit board PCB, and the first to ninth controllers 210_1 to 210_9 may be in first and second peripheral areas PA_P1 and PA_P2 of the printed circuit board PCB adjacent the light-emitting device 100. For example, the first to fourth controllers 210_1 to 210_4 may be in the first peripheral area PA_P1, and the fifth to ninth controllers 210_5 to 210_9 may be in the second peripheral area PA_P2. Because the light-emitting device 100 is interposed between the first to ninth controllers 210_1 to 210_9 in the first and second peripheral areas PA_P1 and PA_P2 of the printed circuit board PCB, it may become easy to form wirings or wires configured to electrically connect the first to ninth controllers 210_1 to 210_9 to the first to ninth cell blocks BLK1 to BLK9.

In an example embodiment, the light-emitting device 100 may overlap the first to ninth controllers 210_1 to 210_9 in a direction (e.g., the first direction X or the second direction Y) parallel to the main surface of the printed circuit board PCB. In an example embodiment, the second peripheral area PA_P2, the central area CA_P, and the first peripheral area PA_P1 may be sequentially arranged in the second direction Y.

In the light source module 10, one light-emitting device 100 including light-emitting cells configured to emit light may be in the central area CA_P of the printed circuit board PCB, and the first to ninth controllers 210_1 to 210_9, which are configured to drive the light-emitting device 100 and respectively include separate chips, may be in the first and second peripheral areas PA_P1 and PA_P2. Because the light-emitting device 100 including the plurality of light-emitting cells and the first to ninth controllers 210_1 to 210_9 are implemented as separate chips, designing the first to ninth controllers 210_1 to 210_9 may not be affected by the structures of the plurality of light-emitting cells. Accordingly, the design efficiency of the first to ninth controllers 210_1 to 210_9 may be increased.

In addition, the light-emitting device 100 may be implemented as one LED chip and arranged in the central area CA_P of the printed circuit board PCB, and thus, light emitted from the light source module 10 may be concentrated in the central area CA_P. Because the emitted light is concentrated in the central area CA_P, the number of additional components (e.g., lenses) configured to condense the emitted light may be reduced. For instance, the light source module 10 may not include lenses. As the number of lenses included in the light source module 10 increases, the amount of light lost by the lenses may increase. Thus, the luminous efficiency of the light source module 10 may increase.

The light source module 10 may further include an input unit configured to receive signals required for operations of the light source module 10 from the outside. The first to ninth controllers 210_1 to 210_9 may receive control signals from the input unit, and the first to ninth controllers 210_1 to 210_9 may control operations thereof in response to the control signals.

In an example embodiment, the first to ninth controllers 210_1 to 210_9 may be electrically connected to each other in sequential order. For example, the first controller 210_1 may be electrically connected to the second controller 210_2, the second controller 210_2 may be electrically connected to the first controller 210_1 and the third controller 210_3, and the third controller 210_3 may be electrically connected to the second controller 210_2 and the fourth controller 210_4. The first controller 210_1 may receive a control signal from the input unit and transmit the control signal to the second controller 210_2, and the second controller 210_2 may receive a control signal from the first controller 210_1 and transmit the control signal to the third controller 210_3. The description of the first and second controllers 210_1 and 210_2 may be equally applied to the third to ninth controllers 210_3 to 210_9.

The printed circuit board PCB may include a metal and a metal compound. The printed circuit board PCB may be a metal-core printed circuit board (MCPCB), which includes, for example, copper (Cu).

In an example embodiment, the printed circuit board PCB may be a flexible printed circuit board (FPCB), which may be flexible and easily modified into various shapes. In addition, the printed circuit board PCB may be a FR4-type PCB and include a resin material including epoxy, triazine, silicon, and polyimide or a ceramic material, such as silicon nitride, aluminum nitride (AlN) and aluminum oxide ($Al_2O_3$).

Figure 3:
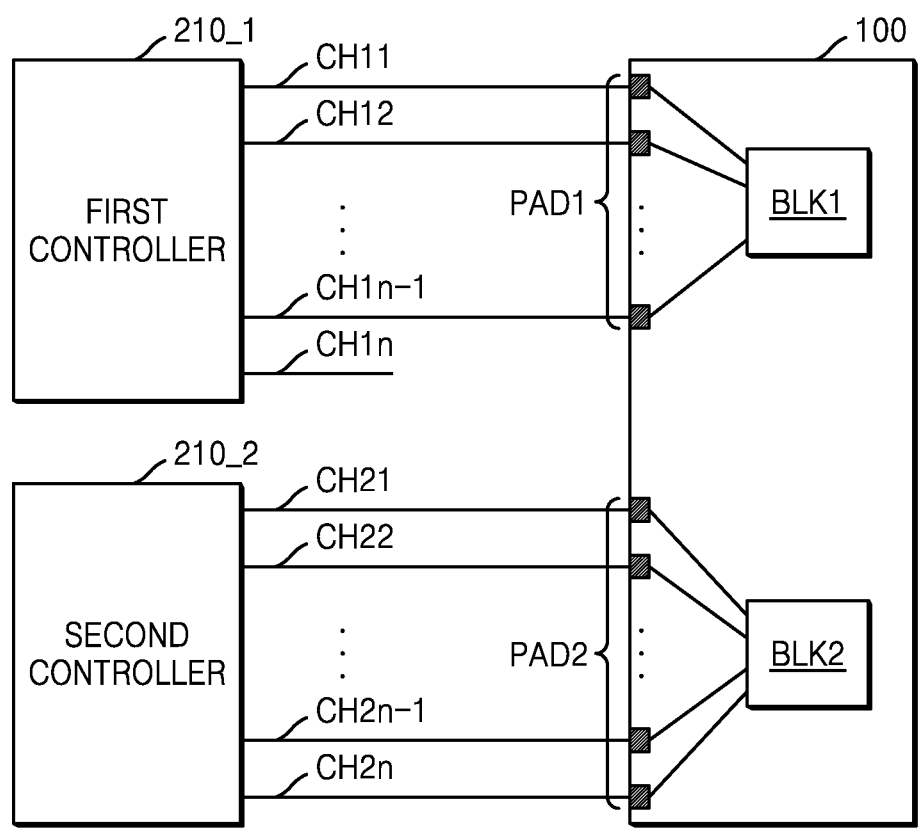
FIG. 3 is a block diagram for explaining the connection of controllers to a light-emitting device in a light source module according to an example embodiment.

FIG. 3 is a block diagram for explaining the connection of controllers to a light-emitting device 100 in a light source module 10 according to an example embodiment. Only a first cell block and a second cell block connected to a first controller and a second controller are illustrated in FIG. 3 for brevity, and the same description may be applied to other controllers (e.g., the third to ninth 210_3 to 210_9) and other cell blocks (e.g., the third to ninth BLK3 to BLK9).

Referring to FIG. 3, the light-emitting device 100 may include a first cell block BLK1 including a plurality of first light-emitting cells and a second cell block BLK2 including a plurality of second light-emitting cells. The light-emitting device 100 may include a plurality of first pads PAD1 connected to the first cell block BLK1 and a plurality of second pads PAD2 connected to the second cell block BLK2.

In an example embodiment, the number of first light-emitting cells in the first cell block BLK1 may be less than the number of second light-emitting cells in the second cell block BLK2. The number of first pads PAD1 connected to the first cell block BLK1 may be less than the number of second pads PAD2 connected to the second cell block BLK2. Although FIG. 3 illustrates a case in which the number of first pads PAD1 is one less than the number of second pads PAD2, example embodiments are not limited thereto, and the number of first pads PAD1 may at least two less than the number of second pads PAD2.

A first controller 210_1 may be connected to a plurality of first channels CH11 to CH1$n$ and drive the first cell block BLK1, which is a cell block corresponding to the first controller 210_1, through at least some (e.g., CH11 to CH1$n$-1) of the plurality of first channels CH11 to CH1$n$. The first controller 210_1 may apply a voltage to the first cell block BLK1 corresponding thereto through the at least some first channels CH11 to CH1$n$-1 and adjust the intensity of light emitted from the first cell block BLK1.

A second controller 210_2 may be connected to a plurality of second channels CH21 to CH2$n$ and drive a second cell block BLK2, which is a cell block corresponding to the second controller 210_2, through at least some of the plurality of second channels CH21 to CH2$n$. The second controller 210_2 may apply a voltage to the second cell block BLK2 corresponding thereto through the at least some of the second channels CH21 to CH2$n$ and adjust the intensity of light emitted from the second cell block BLK2.

In an example embodiment, the plurality of first channels CH11 to CH1$n$ connected to the first controller 210_1 may be different channels from the plurality of second channels CH21 to CH2$n$ connected to the second controller 210_2. Accordingly, the first controller 210_1 and the second controller 210_2, which are different controllers, may individually control cell blocks corresponding respectively thereto.

In an example embodiment, the first controller 210_1 and the second controller 210_2 may be connected to the same number of channels. For example, the first controller 210_1 may be connected to n first channels CH11 to CH1$n$ and apply a voltage to each of the first channels CH11 to CH1$n$. The second controller 210_2 may be connected to n second channels CH21 to CH2$n$ and apply a voltage to each of the second channels CH21 to CH2$n$.

In an example embodiment, the number (e.g., (n-1)) of first pads PAD1 may be less than the number (e.g., n) of first channels CH11 to CH1$n$ connected to the first controller 210_1. At least one channel (e.g., CH1$n$) of the plurality of first channels CH11 to CH1$n$ may not be connected to the plurality of first pads PAD1 but be electrically isolated from the first cell block BLK1. Accordingly, the number of channels connected to the first to ninth controllers 210_1 to 210_9 of the light source module 10 of FIG. 2 may not correspond to the number of pads formed in the light-emitting device 100.

However, example embodiments are not limited to the illustration of FIG. 3. Because the number of first light-emitting cells included in the first cell block BLK1 is less than the number of second light-emitting cells included in the second cell block BLK2, the number of first channels CH11 to CH1$n$ connected to the first controller 210_1 configured to control an operation of the first cell block BLK1 may be less than the number of second channels CH21 to CH2$n$ connected to the second controller 210_2 configured to control an operation of the second cell block BLK2.

Figure 4:
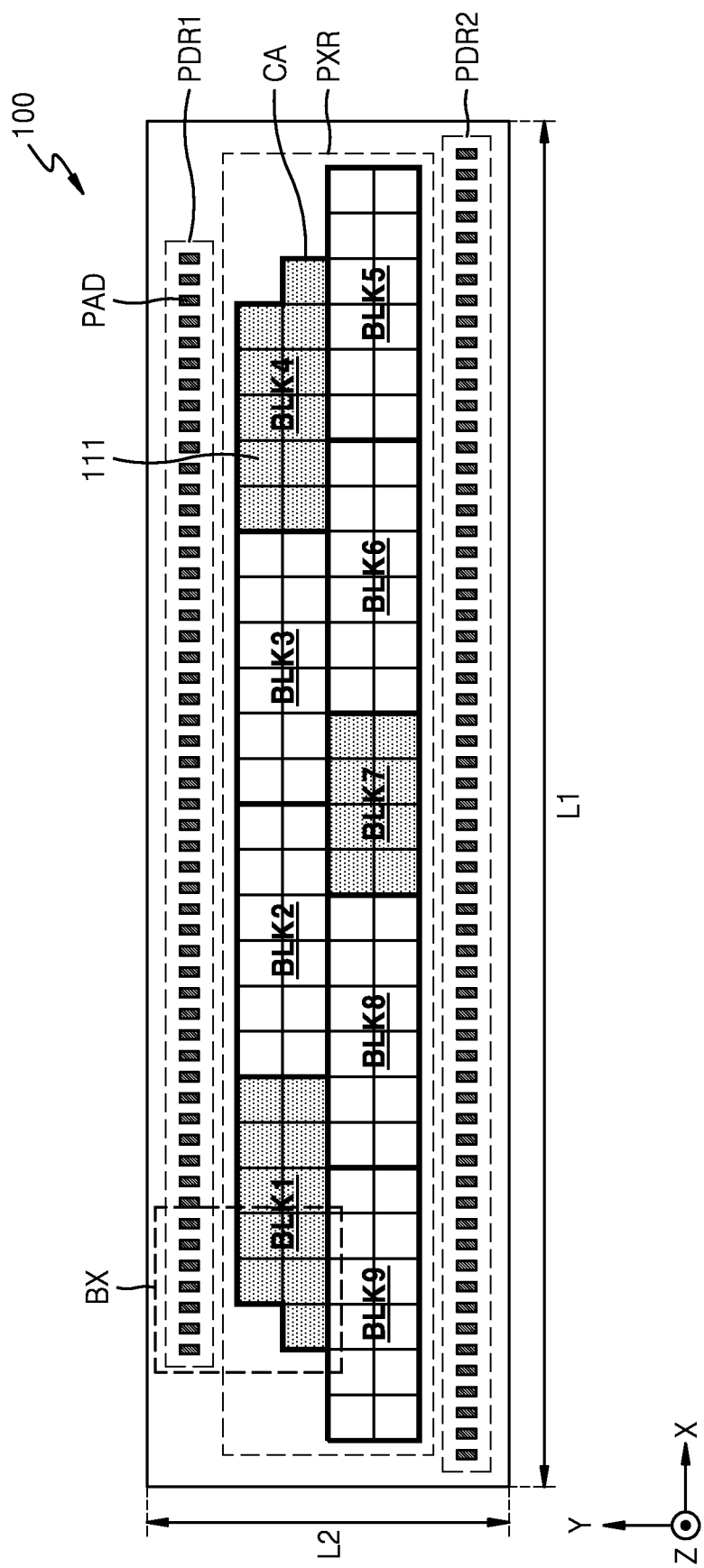
FIG. 4 is a perspective view of a configuration of a light-emitting device according to an example embodiment.

FIG. 4 is a perspective view of a configuration of a light-emitting device 100 according to an example embodiment.

Referring to FIG. 4, the light-emitting device 100 may include a cell array region PXR in which a cell array CA is formed and first and second pad regions PDR1 and PDR2 in which a plurality of pads PAD are formed. The cell array region PXR may be in a central area of the light-emitting device 100, and the first and second pad regions PDR1 and PDR2 may be in a peripheral area surrounding the central area. For instance, the second pad region PDR2, the cell array region PXR, and the first pad region PDR1 may be sequentially arranged in a second direction Y.

The cell array CA may include a plurality of cell blocks (e.g., first to ninth cell blocks BLK1 to BLK9). In this case, the first to ninth cell blocks BLK1 to BLK9 may be electrically isolated from each other. Although a total of nine cell blocks BLK1 to BLK9 are illustrated in FIG. 4, the light-emitting device 100 is not limited thereto, and the number and arrangement of cell blocks (e.g., BLK1 to BLK9) may be changed.

The first to ninth cell blocks BLK1 to BLK9 may be arranged in a first row and a second row, which are arranged in parallel to each other in the second direction Y. For example, the first to fourth cell blocks BLK1 to BLK4 may be arranged in the first row, and the fifth to ninth cell blocks BLK5 to BLK9 may be arranged in a second row. At least one of the plurality of cell blocks BLK1 to BLK9 may include a different number of light-emitting cells 111 from other cell blocks. In an example embodiment, the first cell block BLK1 and the fourth cell block BLK4 at both ends of the first row may include a smaller number light-emitting cells 111 than at least one of other cell blocks. For example, the first cell block BLK1 and the fourth cell block BLK4, which are at both ends of the cell array CA, may include a smaller number of light-emitting cells 111 than other cell blocks positioned adjacent thereto. The first cell block BLK1 may include a smaller number of light-emitting cells 111 than the second cell block BLK2, which is adjacent to the first cell block BLK1 in a first direction X. Alternatively, the first cell block BLK1 may include a smaller number of light-emitting cells 111 than the ninth cell block BLK9, which is adjacent to the first cell block BLK1 in an opposite direction to the second direction Y. The fourth cell block BLK4 may include a smaller number of light-emitting cells 111 than the third cell block BLK3, which is adjacent to the fourth cell block BLK4 in an opposite direction to the first direction X. Alternatively, the fourth cell block BLK4 may include a smaller number of light-emitting cells 111 than the fifth cell block BLK5, which is adjacent to the fourth cell block BLK4 in an opposite direction to the second direction Y.

In an example embodiment, the seventh cell block BLK7 in the center of the cell array CA may include a smaller number of light-emitting cells 111 than at least one of other cell blocks. For example, the seventh cell block BLK7 may include a smallest number of light-emitting cells 111 from among the first to ninth cell blocks BLK1 to BLK9.

FIG. 4 illustrates an example in which each of the second, third, fifth, sixth, eighth, and ninth cell blocks BLK2, BLK3, BLK5, BLK6, BLK8, and BLK9 includes twelve light-emitting cells 111, each of the first and fourth cell blocks BLK1 and BLK4 includes eleven light-emitting cells, and the seventh cell block BLK7 includes eight light-emitting cells, however example embodiments are not limited thereto. In this regard, number of light-emitting cells 111 included in each of the first to ninth cell blocks BLK1 to BLK9 may be variously selected.

In an example embodiment, from among light-emitting cells included in cell blocks arranged in the first row, light-emitting cells adjacently arranged in the second direction Y may be driven (or turned on) or may not be driven (or turned off) simultaneously. In an example embodiment, partition walls may not be formed between the light-emitting cells adjacently arranged in the second direction Y, from among the light-emitting cells included in the cell blocks arranged in the first row. In an example embodiment, the first to ninth cell blocks BLK1 to BLK9 may be arranged in a rectangular shape such that the length L1 of the light-emitting device 100 in the first direction X is greater than a length L2 of the light-emitting device 100 in the second direction Y. For example, the first to ninth cell blocks BLK1 to BLK9 may be arranged in a total of two rows, for example, a first row and a second row.

In an example embodiment, the length L1 of the light-emitting device 100 in the first direction X may be about 1.1 times or more the length L2 of the light-emitting device 100 in the second direction Y. In an example embodiment, the length L1 of the light-emitting device 100 in the first direction X may be about 100 times or less the length L2 of the light-emitting device 100 in the second direction Y. According to an example embodiment, a thickness of the light-emitting device 100 (i.e., a length of the light-emitting device 100 in a third direction Z) may be several tens of μm to several hundreds of μm and may be less than or equal to about 1/10 of the length L1 of the light-emitting device 100 in the first direction X. Because the light-emitting device 100 having the above-described dimensions has dimensions optimized for resistance to physical stress, the warpage of the light-emitting device 100 may be minimized.

The first to fourth cell blocks BLK1 to BLK4 may be sequentially arranged in the first row in the first direction X, and the fifth to ninth cell blocks BLK5 to BLK9 may be sequentially arranged in the second row in an opposite direction to the first direction X. Although FIG. 4 illustrates the first to ninth cell blocks BLK1 to BLK9 arranged in two rows, example embodiments are not limited thereto, and the cell array CA may include the first to ninth cell blocks BLK1 to BLK9 arranged in at least three rows.

The first to fourth cell blocks BLK1 to BLK4 arranged in the first row may be electrically connected to first to fourth controllers (e.g., 210_1 to 210_4 of FIG. 2) through the plurality of pads PAD arranged in the first pad region PDR1. The fifth to ninth cell blocks BLK5 to BLK9 arranged in the second row may be electrically connected to fifth to ninth controllers (e.g., 210_5 to 210_9 of FIG. 2) through the plurality of pads PAD arranged in the second pad region PDR2.

In the light-emitting device 100, the first and second pad regions PDR1 and PDR2 may not be in the cell array region PXR but be arranged in parallel with each other and extend in the second direction Y. That is, the first and second pad regions PDR1 and PDR2 in which the plurality of pads PAD are arranged may not overlap the cell array region PXR in the third direction Z, which is perpendicular to a main surface of a substrate. Because the light-emitting device 100 includes the first and second pad regions PDR1 and PDR2 separately from the cell array region PXR, the density of the light-emitting cells 111 in the cell array region PXR may be increased. Furthermore, a plurality of pads PAD may be in the peripheral area of the light-emitting device 100, and thus, it may be easy to form components (e.g., bonding wires) configured to driving chips to the plurality of pads PAD.

In example embodiments, in a view from above, an area of the cell array region PXR may be in a range of about 50% to about 90% of a total area of the light-emitting device 100, and an area of the first and second pad regions PDR1 and PDR2 may be in a range of about 10% to about 50% of the total area of the light-emitting device 100, without being limited thereto.

Figure 5:
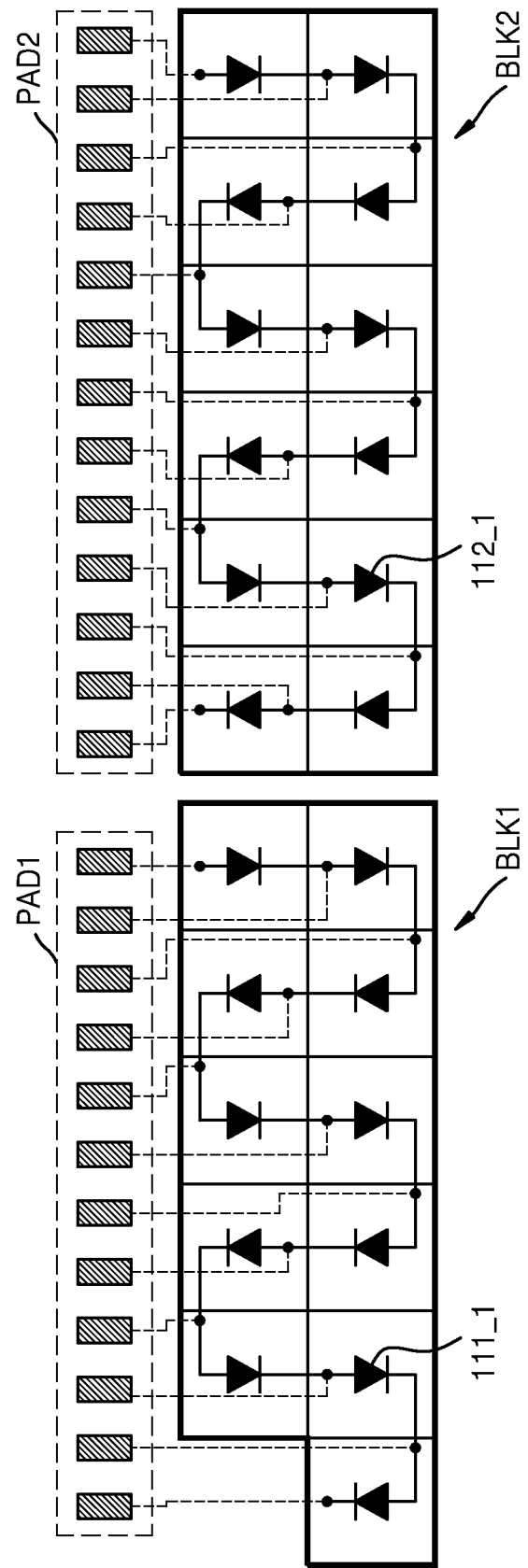
FIGS. 5 and 6 are circuit diagrams for explaining connection relationships between light-emitting cells in a light-emitting device according to an example embodiment.
Figure 6:
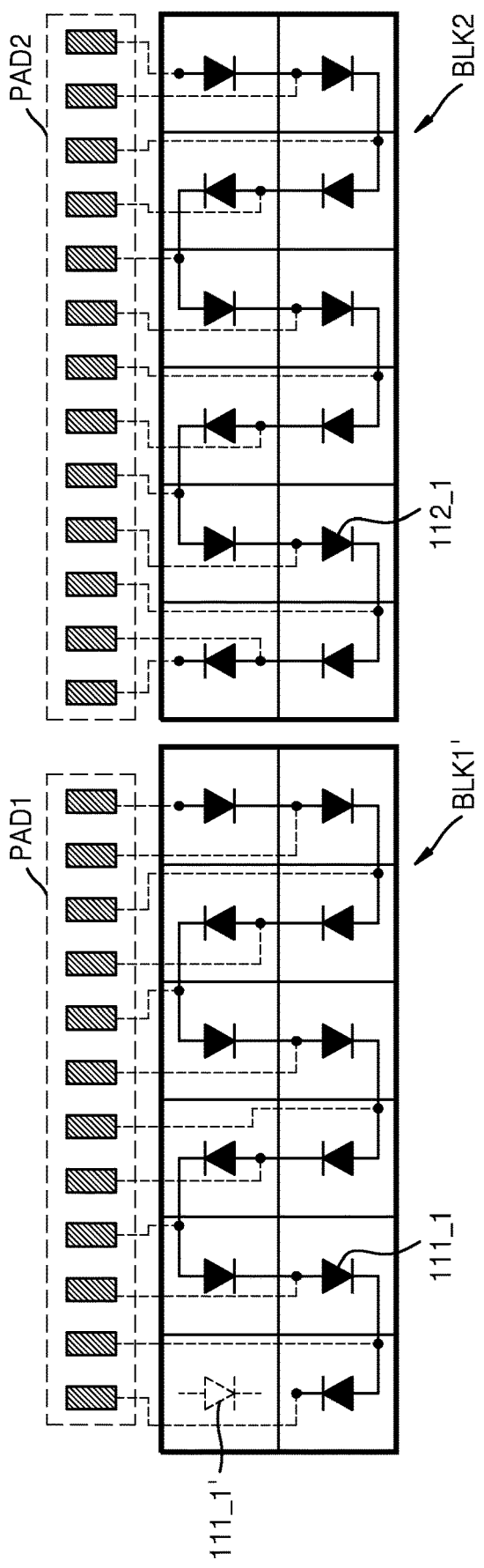

FIGS. 5 and 6 are circuit diagrams for explaining connection relationships between light-emitting cells in a light-emitting device 100 according to an example embodiment. FIGS. 5 and 6 are equivalent circuit diagrams of the first cell block BLK1 and the second cell block BLK2 of FIG. 4. In FIGS. 5 and 6, one light-emitting cell may correspond to one diode. The description of the first and second cell blocks BLK1 and BLK2 of FIGS. 5 and 6 may be equally applied to the third to ninth cell blocks BLK3 to BLK9 of FIG. 4.

Referring to FIGS. 4 and 5, the first cell block BLK1 may include a plurality of first light-emitting cells 111_1, each of which is implemented as an LED, and the second cell block BLK2 may include a plurality of second light-emitting cells 111_2, each of which is implemented as an LED. The number of first light-emitting cells 111_1 may be less than the number of second light-emitting cells 111_2. The first cell block BLK1 and the second cell block BLK2 may be electrically insulated from each other, and operations of the first cell block BLK1 and the second cell block BLK2 may be controlled by different controllers.

Cathodes or anodes of the light-emitting cells (refer to 111 in FIG. 4) included in each of the first to ninth cell blocks BLK1 to BLK9 may be electrically connected to each other. For example, cathodes or anodes of the plurality of first light-emitting cells 111_1 included in the first cell block BLK1 may be electrically connected to each other.

In an example embodiment, the light-emitting cells 111 included in each of the first to ninth cell blocks BLK1 to BLK9 may be connected in series to other light-emitting cells 111 within the same block. For example, the plurality of first light-emitting cells 111_1 in the first cell block BLK1 may be connected in series to each other, and the plurality of second light-emitting cells 111_2 in the second cell block BLK2 may be connected in series to each other. The plurality of first light-emitting cells 111_1 in the first cell block BLK1 may be electrically isolated from the plurality of second light-emitting cells 111_2 in the second cell block BLK2. Both ends of each of the plurality of first light-emitting cells 111_1 and the plurality of second light-emitting cells 111_2 may be respectively connected to different pads.

Because the plurality of first light-emitting cells 111_1 are connected in series to each other and the plurality of second light-emitting cells 111_2 are connected in series to each other, when voltages applied to nodes at which the plurality of first light-emitting cells 111_1 are connected to each other and nodes at which the plurality of second light-emitting cells 111_2 are connected to each other are controlled, operations of the plurality of first light-emitting cells 111_1 and the plurality of second light-emitting cells 111_2 may be controlled. Accordingly, the number of first pads PAD1 connected to the plurality of first light-emitting cells 111_1 may be less than twice the number of first light-emitting cells 111_1, and the number of second pads PAD2 connected to the plurality of second light-emitting cells 111_2 may be less than twice the number of second light-emitting cells 111_2.

A first controller 210_1 may be electrically connected to a plurality of first pads PAD1. The first controller 210_1 may adjust voltages applied to two different pads, from among the plurality of first pads PAD1, and thus, one light-emitting cell of which a cathode and an anode are respectively connected to the two pads may be driven. For example, the first controller 210_1 may adjust a brightness of each of the first light-emitting cells 111_1 using a pulse width modulation (PWM) scheme. That is, the first controller 210_1 may adjust the brightness of each of the plurality of first light-emitting cells 111_1 by modulating a pulse width of a voltage applied to each of the plurality of first pads PAD1.

A second controller 210_2 may be electrically connected to a plurality of second pads PAD2. The second controller 210_2 may adjust voltages applied to two different pads, from among the plurality of second pads PAD2, and thus, one light-emitting cell of which a cathode and an anode are respectively connected to the two pads may be driven.

According to an order in which the first cell block BLK1 and the second cell block BLK2 are arranged, the plurality of first pads PAD1 and the plurality of second pads PAD2 corresponding respectively to the first cell block BLK1 and the second cell block BLK2 may be arranged in sequential order. The first cell block BLK1 and the plurality of first pads PAD1 may be arranged in parallel and extend along a second direction Y, and the second cell block BLK2 and the plurality of second pads PAD2 may be arranged in parallel and extend along the second direction Y.

Referring to FIG. 6, a first cell block BLK1' may further include a plurality of first light-emitting cells 111_1 and a dummy light-emitting cell 111_1', each of which is implemented as an LED. The dummy light-emitting cell 111_1' may not be connected to the plurality of first pads PAD1 and may not substantially operate. In an example embodiment, the number of first light-emitting cells 111_1 and the dummy light-emitting cell 111_1' included in the first cell block BLK1' may be equal to the number of second light-emitting cells 111_2 included in the second cell block BLK2.

Figure 7:
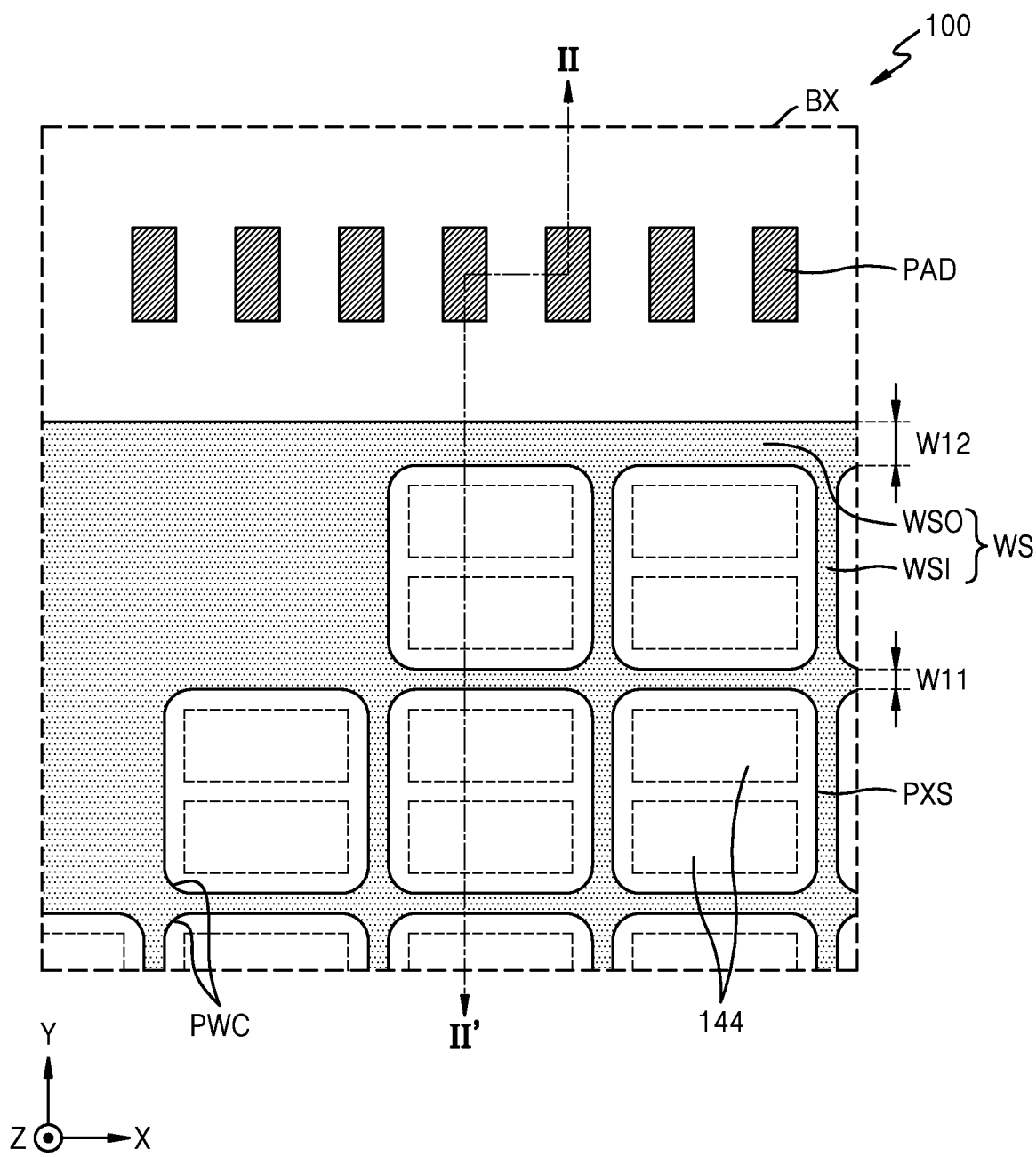
FIGS. 7 to 9 are diagrams of a light-emitting device according to example embodiments.
Figure 8:
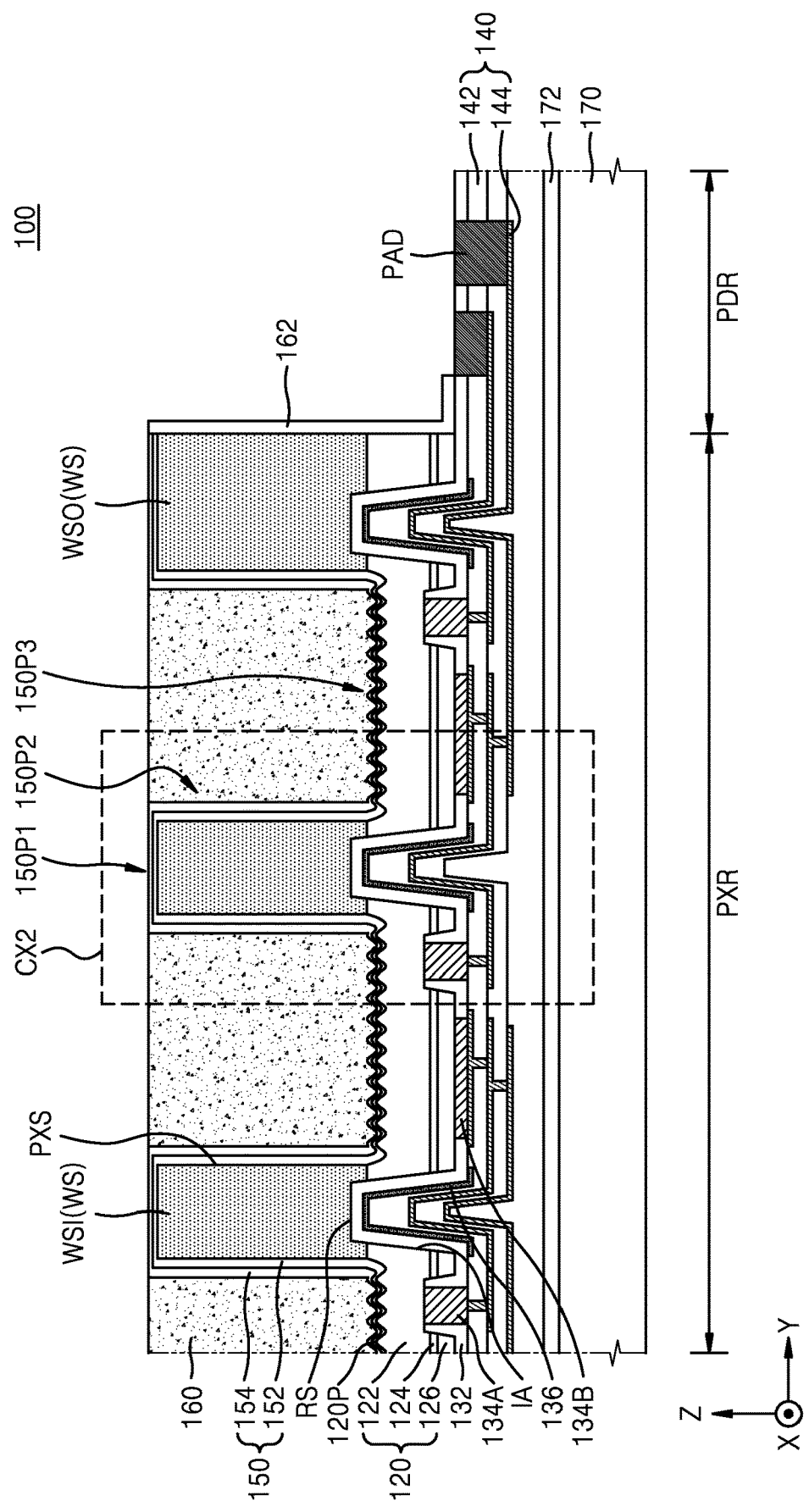
Figure 9:
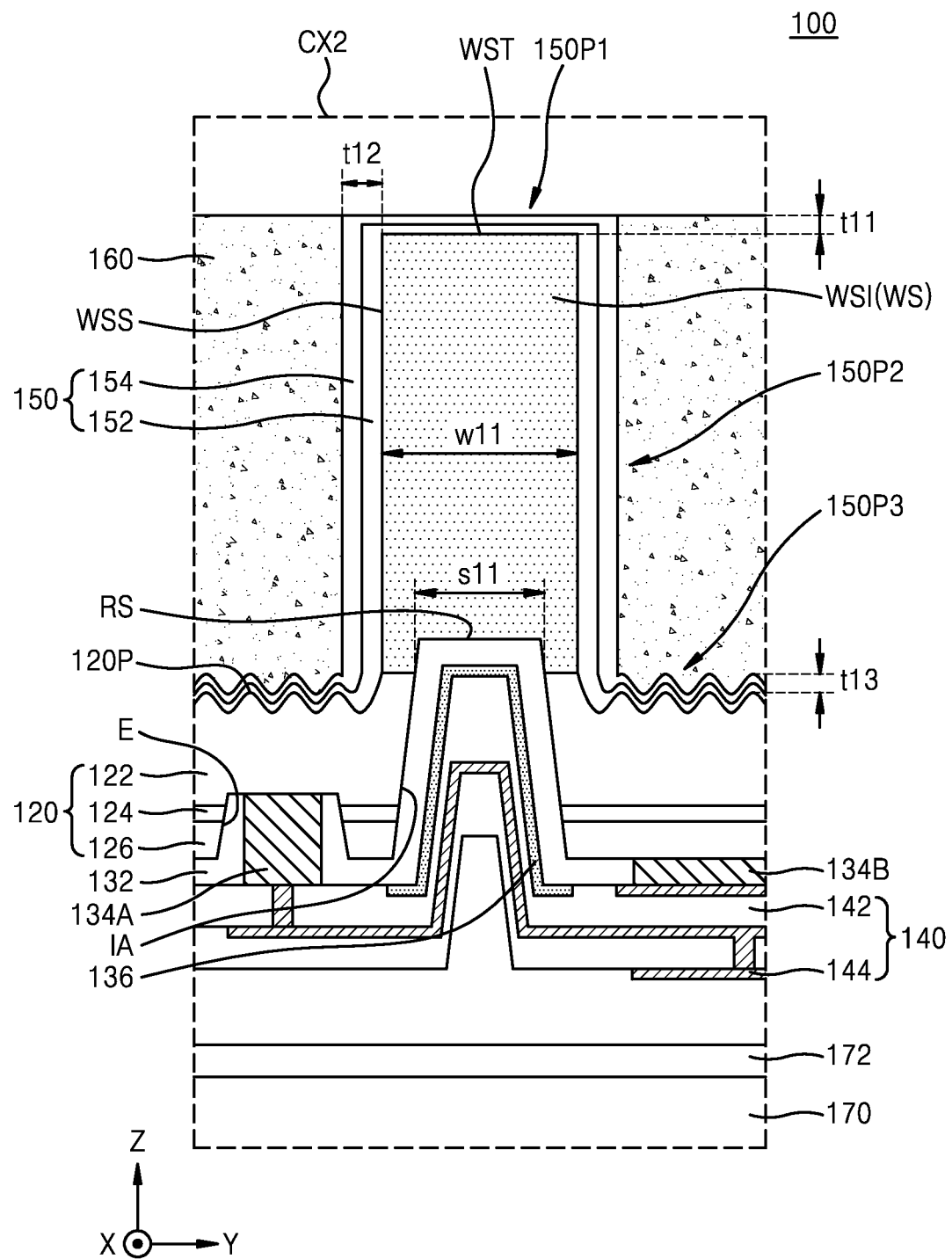

FIGS. 7 to 9 are diagrams of a light-emitting device 100 according to example embodiments. FIG. 7 is an enlarged plan view of region BX of FIG. 4. FIG. 7 illustrates an example of the light-emitting device 100, in which a first cell block does not include a dummy light-emitting cell as shown in FIG. 5. FIG. 8 is an enlarged cross-sectional view of configurations of some components, which is taken along line II-II' of FIG. 7, according to an example embodiment. FIG. 9 is an enlarged view of region CX2 of FIG. 8.

Referring to FIGS. 7 to 9, a partition wall structure WS may be on a plurality of light-emitting structures 120. As shown in FIG. 7, the partition wall structure WS may include a plurality of partition walls WSI and an outer partition wall WSO. The plurality of partition walls WSI may define a plurality of cell spaces PXS in a cell array region PXR, and the outer partition wall WSO may be on outermost edges of the plurality of partition walls WSI. Light-emitting cells may be respectively disposed in the plurality of cell spaces PXS.

The partition wall structure WS may include round-corner sidewall units PWC facing the plurality of cell spaces PXS. The plurality of cell spaces PXS having corners rounded by the round-corner sidewall units PWC of the partition wall structure WS may be respectively defined.

Each of the plurality of partition walls WSI may have a first width w11 of about 10 µm to about 100 µm in a lateral direction (i.e., a second direction Y). The outer partition wall WSO may have a second width w12 of about 10 µm to about 1 mm in the lateral direction (i.e., the second direction Y). The partition wall structure WS may be formed such that the outer partition wall WSO is formed to have the second width w12 greater than the first width w11 of the plurality of partition walls WSI. Thus, the structural stability of the light-emitting device 100 may be improved. For example, even when repetitive vibration and impact are applied to the light-emitting device 100 when the light-emitting device 100 is used as a headlamp for a vehicle, the reliability of the light-emitting device 100 may be improved by excellent structural stability between the partition wall structures WS and the fluorescent layer 160 positioned within the partition wall structures WS.

Each of the plurality of light-emitting structures 120 may include a first conductive semiconductor layer 122, an active layer 124, and a second conductive semiconductor layer 126. An insulating liner 132, a first contact 134A, a second contact 134B, and a wiring structure 140 may be on a bottom surface of each of the plurality of light-emitting structures 120.

For brevity, as shown in FIG. 9, a surface of the light-emitting structure 120, which faces the plurality of partition walls WSI, may be referred to as a top surface of the light-emitting structure 120, while a surface of the light-emitting structure 120 opposite to the top surface of the light-emitting structure 120 (i.e., a surface of the light-emitting structure 120 positioned far from the plurality of partition walls WSI) may be referred to as a bottom surface of the light-emitting structure 120. For example, the first conductive semiconductor layer 122, the active layer 124, and the second conductive semiconductor layer 126 may be stacked in the vertical direction (i.e., a third direction (Z)) from the top surface of the light-emitting structure 120 to the bottom surface thereof. Thus, the top surface of the light-emitting structure 120 may correspond to a top surface of the first conductive semiconductor layer 122, and the bottom surface of the light-emitting structure 120 may correspond to a bottom surface of the second conductive semiconductor layer 126.

The first conductive semiconductor layer 122 may be a nitride semiconductor having a composition of n-type $In_xAl_yGa_{(1-x-y)}N$ (where $0 \leq x < 1$, $0 \leq y < 1$, and $0 \leq x+y < 1$). For example, the n-type impurities may be silicon (Si). For example, the first conductive semiconductor layer 122 may include GaN containing n-type impurities.

In example embodiments, the first conductive semiconductor layer 122 may include a first conductive semiconductor contact layer and a current diffusion layer. An impurity concentration of the first conductive semiconductor contact layer may be in a range of $2 \times 10^{18}$ cm$^{-3}$ to $9 \times 10^{19}$ cm$^{-3}$. A thickness of the first conductive semiconductor contact layer may be about 1 μm to about 5 μm. The current diffusion layer may have a structure in which a plurality of In$_x$Al$_y$Ga$_{(1-x-y)}$N layers (where 0≤x, y<1, and 0≤x+y<1) having different compositions or different impurity contents are alternately stacked. For example, the current diffusion layer may have an n-type superlattice structure in which n-type GaN layers and/or Al$_x$In$_y$Ga$_z$N layers (where 0≤x,y,z≤1, and x+y+z≠0) each having a thickness of about 1 nm to about 500 nm are alternately stacked. An impurity concentration of the current diffusion layer may be in the range of $2 \times 10^{18}$ cm$^{-3}$ to $9 \times 10^{19}$ cm$^{-3}$.

The active layer 124 may be interposed between the first conductive semiconductor layer 122 and the second conductive semiconductor layer 126. The active layer 124 may discharge light having some energy by recombination of electrons and holes during the driving of the light-emitting device 100. The active layer 124 may have a multiple quantum well (MQW) structure in which quantum well layers and quantum barrier layers are alternately stacked. For example, each of the quantum well layers and each of the quantum barrier layers may include In$_x$Al$_y$Ga$_{(1-x-y)}$N layers (where 0≤x, y≤1, and 0≤x+y≤1) having different compositions. For example, the quantum well layer may include In$_x$Ga$_{1-x}$N (where 0≤x≤1), and the quantum barrier layer may include GaN or AlGaN. Thicknesses of the quantum well layer and the quantum barrier layer may be in the range of about 1 nm to about 50 nm. The active layer 124 is not limited to having the MQW structure and may have a single quantum well structure.

The second conductive semiconductor layer 126 may include a nitride semiconductor layer having a composition of p-type In$_x$Al$_y$Ga$_{(1-x-y)}$N (where 0≤x<1, 0≤y<1, and 0≤x+y≤1). For example, the p-type impurities may be magnesium (Mg).

In example embodiments, the second conductive semiconductor layer 126 may include an electron blocking layer, a low-concentration p-type GaN layer, and a high-concentration p-type GaN layer, which are stacked in a vertical direction. For example, the electron blocking layer may have a structure in which a plurality of In$_x$Al$_y$Ga$_{(1-x-y)}$N layers (where 0≤x, y≤1, and 0≤x+y≤1) having a thickness of about 5 nm to about 100 nm and having different compositions are alternately stacked, or may include a single layer including Al$_y$Ga$_{(1-y)}$N (where 0<y≤1). An energy band gap of the electron blocking layer may be reduced in a direction away from the active layer 124. For example, aluminum (Al) content in the electron blocking layer may be reduced in the direction away from the active layer 124.

Each of the plurality of light-emitting structures 120 may be spaced apart from light-emitting structures 120 adjacent thereto with a device isolation region IA interposed therebetween. A distance s11 between the plurality of light-emitting structures 120 may be less than the first width w11 of each of the plurality of partition walls WSI, without being limited thereto.

The insulating liner 132 may be positioned to conformally cover an inner wall of the device isolation region IA and a side surface of each of the plurality of light-emitting structures 120. Also, the insulating liner 132 may be on an inner wall of the opening E, which completely passes through the active layer 124 and the second conductive semiconductor layer 126. In example embodiments, the insulating liner 132 may include silicon oxide, silicon oxynitride, or silicon nitride. In some example embodiments, the insulating liner 132 may have a structure in which a plurality of insulating layers are stacked.

The first contact 134A may be connected to the first conductive semiconductor layer 122 in the opening E penetrating the active layer 124 and the second conductive semiconductor layer 126. The second contact 134B may be on the bottom surface of the second conductive semiconductor layer 126. The insulating liner 132 may electrically insulate the first contact 134A from the active layer 124 and the second conductive semiconductor layer 126. The insulating liner 132 may be interposed between the first contact 134A and the second contact 134B on the bottom surface of the second conductive semiconductor layer 126 and electrically insulate the first contact 134A from the second contact 134B. Each of the first contact 134A and the second contact 234B may include silver (Ag), aluminum (Al), nickel (Ni), chromium (Cr), gold (Au), platinum (Pt), palladium (Pd), tin (Sn), tungsten (W), rhodium (Rh), iridium (Ir), ruthenium (Ru), magnesium (Mg), zinc (Zn), titanium (Ti), copper (Cu), or a combination thereof. Each of the first contact 134A and the second contact 134B may include a metal material having high reflectivity.

A lower reflective layer 136 may be on the insulating liner 132 positioned on the inner wall of the device isolation region IA. The lower reflective layer 136 may reflect light emitted from sidewalls of the plurality of light-emitting structures 120 and direct the reflected light into the plurality of cell spaces PXS.

In example embodiments, the lower reflective layer 136 may include Ag, Al, Ni, Cr, Au, Pt, Pd, Sn, W, Rh, Ir, Ru, Mg, Zn, Ti, Cu, or a combination thereof. The lower reflective layer 136 may include a metal material having high reflectivity. In other example embodiments, the lower reflective layer 136 may include a distributed Bragg reflector (DBR). For example, the DBR may have a structure in which a plurality of insulating layers having different refractive indexes are repeatedly stacked. Each of the insulating layers in the DBR may include oxide, nitride, or a combination thereof, for example, SiO$_2$, SiN, SiO$_x$N$_y$, TiO$_2$, Si$_3$N$_4$, Al$_2$O$_3$, TiN, AlN, ZrO$_2$, TiAlN, or TiSiN.

A wiring structure 140 may be on the insulating liner 132, the first contact 134A, the second contact 134B, and the lower reflective layer 136. The wiring structure 140 may include a plurality of insulating layers 142 and a plurality of wiring layers 144. The plurality of wiring layers 144 may electrically connect each of the first contact 134A and the second contact 134B to the pad PAD. Some of the plurality of wiring layers 144 may be on the inner wall of the device isolation region IA, and the plurality of insulating layers 142 may respectively cover the plurality of wiring layers 144 and fill the device isolation region IA. As shown in FIG. 9, the plurality of wiring layers 144 may include at least two wiring layers 144 located at different levels in the vertical direction, but example embodiments are not limited thereto. Each of the plurality of wiring layers 144 may include Ag, Al, Ni, Cr, Au, Pt, Pd, Sn, W, Rh, Ir, Ru, Mg, Zn, Ti, Cu, or a combination thereof.

In example embodiments, the plurality of wiring layers 144 may electrically connect the first contact 134A of one light-emitting structure 120 to the second contact 134B of another light-emitting structure 120 connected in series to the one light-emitting structure 120 so that the plurality of light-emitting cells included in one cell block may be connected in series to each other.

Alternatively, in contrast to the illustration of FIG. 8, in another example embodiment, the plurality of wiring layers 144 may electrically connect the first contact 134A of one light-emitting structure 120 to the first contact 134A of another light-emitting structure 120 connected in parallel to the one light-emitting structure 120 so that the plurality of light-emitting cells included in one cell block may be connected in parallel to each other.

The pad PAD may be in the pad region PDR and connected to the plurality of wiring layers 144. The pad PAD may be at a lower level than the partition wall structure WS. In example embodiments, a sidewall and a bottom surface of the pad PAD may be covered by the plurality of insulating layers 142, and a top surface of the pad PAD may be at a lower level than the top surfaces of the plurality of light-emitting structures 120. In other example embodiments, in contrast to the illustration of FIG. 8, some of the plurality of light-emitting structures 120 may be in the pad region PDR, and the pad PAD may be in openings formed in the plurality of light-emitting structures 120. In this case, the top surface of the pad PAD may be at the same level as the top surfaces of the plurality of light-emitting structures 120. Connection members (e.g., bonding wires) for electrical connection with a controller may be on the pad PAD.

The partition wall structures WS may be on the top surfaces of the plurality of light-emitting structures 120. The partition wall structures WS may include silicon (Si), silicon carbide (SiC), sapphire ($Al_2O_3$), or gallium nitride (GaN). In an example process, after the plurality of light-emitting structures 120 are formed on a substrate (refer to 110 in FIG. 18A), the partition wall structures WS may be formed by removing portions of the substrate 110. In this case, the partition wall structures WS may be portions of the substrate 110, which serve as a growth substrate for forming the light-emitting structures 120.

The plurality of partition walls WSI may be arranged in a matrix form in a plan view, and the plurality of cell spaces PXS may be defined by the plurality of partition walls WSI. Each of the plurality of partition walls WSI may include a recess region RS, which is at a bottom of each of the plurality of partition walls WSI to vertically overlap the device isolation region IA. The recess region RS may be formed by removing a portion of the substrate 110 during an etching process for separating a light-emitting stack into the plurality of light-emitting structures 120. The insulating liner 132 may be arranged to contact the recess region RS on a bottom surface of each of the plurality of partition walls WSI.

The top surfaces of the plurality of light-emitting structures 120 may be exposed at bottoms of the plurality of cell spaces PXS. For example, concave/convex portions 120P may be formed in the top surfaces of the plurality of light-emitting structures 120 positioned at the bottoms of the plurality of cell spaces PXS. Light extraction efficiency of the plurality of light-emitting structures 120 may be improved by the concave/convex portions 120P, but example embodiments are not limited thereto.

A passivation structure 150 may be on a top surface WST and a sidewall WSS of each of the plurality of partition walls WSI. The passivation structure 150 may include a first passivation layer 152 and a second passivation layer 154, which are conformally on the top surface WST and the sidewall WSS of each of the plurality of partition walls WSI. The passivation structure 150 may also be conformally on the top surfaces of the light-emitting structures 120 (e.g., on the concave/convex portions 120P) positioned at the bottoms of the plurality of cell spaces PXS. Although FIG. 8 illustrates two passivation layers (e.g., 152 and 154), example embodiments are not limited thereto, and the passivation structure 150 may include three or more passivation layers.

In example embodiments, the first passivation layer 152 may include a first insulating material, and the second passivation layer 154 may include a second insulating material that is different from the first insulating material. Each of the first insulating material and the second insulating material may include at least one of silicon oxide, silicon nitride, silicon oxynitride, aluminum oxide, and aluminum nitride.

In example embodiments, the passivation structure 150 may include a first portion 150P1 positioned on the top surface WST of each of the plurality of partition walls WSI, a second portion 150P2 positioned on the sidewall WSS of each of the plurality of partition walls WSI, and a third portion 150P3 positioned on the top surfaces of the plurality of light-emitting structures 120. In some example embodiments, a first thickness t11 of the first portion 150P1 may be less than or equal to a second thickness t12 of the second portion 150P2. Also, a third thickness t13 of the third portion 150P3 may be less than or equal to the second thickness t12 of the second portion 150P2. In some example embodiments, the first thickness t11 of the first portion 150P1 may be in a range of about 0.1 μm to about 2 μm, and the second thickness t12 of the second portion 150P2 may be in a range of about 0.5 μm to about 5 μm.

As shown in FIG. 9, portions of the first passivation layer 152 included in the first portion 150P1 (i.e., portions of the first passivation layer 152 on the top surfaces WST of the plurality of partition wall structures WS) may have a thickness less than a thickness of portions of the first passivation layer 152 included in the second portion 150P2 (i.e., portions of the first passivation layer 152 on the sidewalls WSS of the plurality of partition wall structures WS). Similarly, portions of the second passivation layer 154 included in the first portion 150P1 (i.e., portions of the second passivation layer 154 on the top surfaces WST of the plurality of partition wall structures WS) may have a thickness less than a thickness of portions of the second passivation layer 154 included in the second portion 150P2 (i.e., portions of the second passivation layer 154 on the sidewalls WSS of the plurality of partition wall structures WS).

In example embodiments, the first passivation layer 152 may have a relatively uniform thickness on the sidewall WSS of each of the plurality of partition walls WSI. Here, the expression "relatively uniform thickness" may mean that a minimum thickness of the first passivation layer 152 positioned on the sidewall WSS of each of the plurality of partition walls WSI is within about 10% of a maximum thickness thereof. Also, the second passivation layer 154 may have a relatively uniform thickness on the sidewall WSS of each of the plurality of partition walls WSI. In an example manufacturing process, the first and second passivation layers 152 and 154 may be formed using a material having excellent step coverage characteristics or a manufacturing process (e.g., an atomic layer deposition (ALD) process), which is advantageous in forming materials having excellent step coverage characteristics.

For example, the first thickness t11 may be less than a critical thickness for the passivation structure 150 to act as a light guide. For example, when the first thickness t11 of the first portion 150P1 of the passivation structure 150 positioned on the top surface WST of each of the plurality of partition walls WSI is greater than the critical thickness, light emitted from one light-emitting cell may be directed into an adjacent light-emitting cell through the first portion 150P1 of the passivation structure 150. Accordingly, when one light-emitting cell is turned on, light may be absorbed or penetrated into a light-emitting cell adjacent thereto, and thus, the adjacent light-emitting cell may be difficult to be put into a complete off state. When the first thickness t11 of the first portion 150P1 is less than the critical thickness, light emitted from one light-emitting cell may be blocked from an adjacent light-emitting cell through the first portion 150P1 of the passivation structure 150. The first thickness t11 of the first portion 150P1 may be less than or equal to the second thickness t12 of the second portion 150P2. Particularly, the first thickness t11 of the first portion 150P1 may be less than the critical thickness for the passivation structure 150 to act as the light guide. Accordingly, the second portion 150P2 of the passivation structure 150 may provide a sufficient thickness to prevent contamination of the fluorescent layer 160, while undesired light crosstalk between adjacent pixels PX due to the first portion 150P1 of the passivation structure 150 may be prevented.

A fluorescent layer 160 may be inside the plurality of cell spaces PXS on the top surfaces of the plurality of light-emitting structures 120. As shown in FIG. 8, the fluorescent layer 160 may substantially fill the total space of the plurality of cell spaces PXS on the passivation structure 150. A top surface of the fluorescent layer 160 may be at the same level as the top surface WST of each of the plurality of partition walls WSI, but example embodiments are not limited thereto.

The fluorescent layer 160 may include a single material capable of converting the color of light emitted from the light-emitting structure 120 into a desired color. That is, a fluorescent layer 160 associated with the same color may be in the plurality of cell spaces PXS. However, example embodiments are not limited thereto. The color of a fluorescent layer 160 in some of the plurality of cell spaces PXS may be different from the color of a fluorescent layer 160 in the remaining cell spaces PXS.

The fluorescent layer 160 may include a resin containing a fluorescent material dispersed therein or a film containing a fluorescent material. For example, the fluorescent layer 160 may include a fluorescent material film in which fluorescent material particles are uniformly dispersed at a certain concentration. The fluorescent material particles may be a wavelength conversion material that changes the wavelength of light emitted from the plurality of light-emitting structures 120. The fluorescent layer 160 may include at least two kinds of fluorescent material particles having different size distributions to improve the density and color uniformity of the fluorescent material particles.

In example embodiments, the fluorescent material may have various colors and various compositions such as an oxide-based composition, a silicate-based composition, a nitride-based composition, and a fluoride-based composition. For example, β-SiAlON:$Eu^{2+}$ (green), (Ca, Sr)AlSiN$_3$: $Eu^{2+}$ (red), $La_3Si_6N_{11}$:$Ce^{3+}$ (yellow), $K_2SiF_6$:$Mn_4^+$(red), SrLiAl$_3$N$_4$:Eu(red), $Ln_{4-x}(Eu_zM_{1-z})_xSi_{12-y}Al_yO_{3+x+y}N_{18-x-y}$ (0.5≤x≤3, 0<z<0.3, 0<y≤4)(red), $K_2TiF_6$:$Mn_4^+$(red), $NaYF_4$:$Mn_4^+$ (red), $NaGdF_4$:$Mn_4^+$(red), and the like may be used as the fluorescent material. However, the kind of the fluorescent material is not limited thereto.

In other example embodiments, a wavelength conversion material, such as a quantum dot, may be further positioned over the fluorescent layer 160. The quantum dot may have a core-shell structure using a III-V or II-VI compound semiconductor. For example, the quantum dot may have a core such as CdSe and InP and a shell such as ZnS and ZnSe.

In addition, the quantum dot may include a ligand for stabilizing the core and the shell.

A support substrate 170 may be on the wiring structure 140, and an adhesive layer 172 may be interposed between the support substrate 170 and the wiring structure 140. In example embodiments, the adhesive layer 172 may include an electrically insulating material, for example, silicon oxide, silicon nitride, a polymer material such as an ultraviolet (UV)-curable material, or resin. In some example embodiments, the adhesive layer 172 may include a eutectic adhesive material, such as AuSn or NiSi. The support substrate 170 may include a sapphire substrate, a glass substrate, a transparent conductive substrate, a silicon substrate, or a silicon carbide substrate, but is not limited thereto.

In general, a light source module including a plurality of light-emitting device chips may be used for an intelligent lighting system (e.g., a head lamp for a vehicle), and each of the light-emitting device chips may be individually controlled to implement various lighting modes depending on surrounding conditions. When a plurality of light-emitting devices arranged in a matrix form are used, light emitted from each of the plurality of light-emitting devices may be absorbed or penetrated into a light-emitting device adjacent thereto. Thus, contrast characteristics of the light source module may be poor. However, according to example embodiments, by forming the partition wall structures WS on the plurality of light-emitting structures 120, the absorption or penetration of light emitted from one light-emitting cell into an adjacent light-emitting cell may be reduced or prevented.

During a process of forming a passivation layer covering the partition wall structure WS, a thickness of a portion of the passivation layer, which is formed on the top surface of the partition wall structure WS, may be greater than a thickness of a portion of the passivation layer, which is formed on a sidewall of the partition wall structure WS. In this case, the portion of the passivation layer, which is formed on the top surface of the partition wall structure WS, may act as a light guide, and thus, light emitted from one light-emitting cell may be adsorbed or penetrated into an adjacent light-emitting cell. However, according to example embodiments, the first portion 150P1 of the passivation structure 150 may be formed to a thickness less than or equal to a thickness of the second portion 150P2 thereof. Thus, the absorption or penetration of light emitted from one light-emitting cell into an adjacent light-emitting cell through the first portion 150P1 of the passivation structure 150 may be prevented or reduced. Accordingly, contrast characteristics of the light-emitting device 100 may be excellent.

In addition, the fluorescent layer 160 may be firmly fixed in each of the cell spaces PXS by the partition wall structure WS. Even when repetitive vibration and impact are applied to the light-emitting device 100 when the light-emitting device 100 is used as a headlamp for a vehicle, the reliability of the light-emitting device 100 may be improved.

Figure 10:
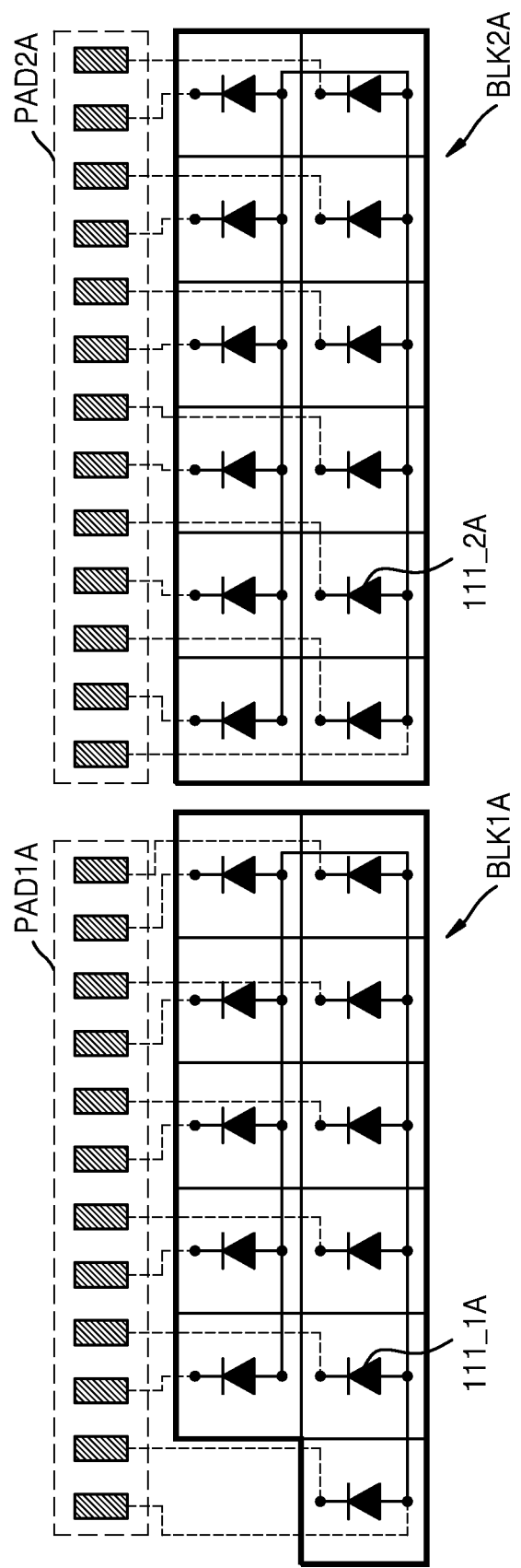
FIGS. 10 and 11 are circuit diagrams for explaining a connection relationship between light-emitting cells included in a light-emitting device according to an example embodiment.
Figure 11:
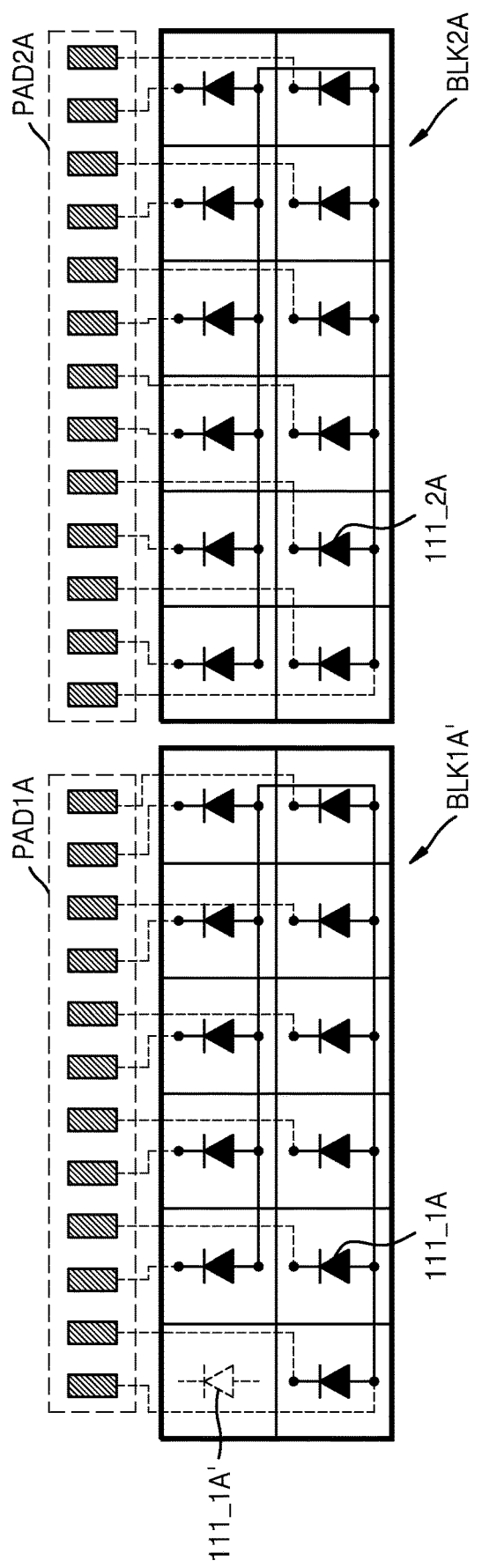

FIGS. 10 and 11 are circuit diagrams for explaining a connection relationship between light-emitting cells included in a light-emitting device 100 according to an example embodiment. FIGS. 10 and 11 are equivalent circuit diagrams of the first cell block BLK1 and the second cell block BLK2 of FIG. 4, according to example embodiments. In FIGS. 10 and 11, one light-emitting cell may correspond to one diode. The description of the first and second cell blocks BLK1 and BLK2 of FIGS. 10 and 11 may be equally applied to the third to ninth cell blocks BLK3 to BLK9 of FIG. 4.

Referring to FIGS. 4 and 10, a first cell block BLK1A may include a plurality of first light-emitting cells 111_1A, each of which is implemented as an LED, and a second cell block BLK2A may include a plurality of second light-emitting cells 111_2A, each of which is implemented as an LED. The number of first light-emitting cells 111_1A may be less than the number of second light-emitting cells 111_2A. The first cell block BLK1A and the second cell block BLK2A may be electrically insulated from each other, and operations of the first cell block BLK1A and the second cell block BLK2A may be controlled by different controllers.

In an example embodiment, the light-emitting cells 111 included in each of the first to ninth cell blocks BLK1A to BLK9 may be connected in parallel to other light-emitting cells 111 within the same block. For example, the plurality of first light-emitting cells 111_1A included in the first cell block BLK1A may be connected in parallel to each other, and the plurality of second light-emitting cells 111_2A included in the second cell block BLK2A may be connected in parallel to each other. One end of each of the plurality of first light-emitting cells 111_1A and the plurality of second light-emitting cells 111_2A may be respectively connected to different pads, and another end of each of the plurality of first light-emitting cells 111_1A and the plurality of second light-emitting cells 111_2A may be connected to a common pad.

Anodes of the plurality of first light-emitting cells 111_1A may be connected to each other, and anodes of the plurality of second light-emitting cells 111_2A may be connected to each other. In contrast to the illustration of FIG. 10, cathodes of the plurality of first light-emitting cells 111_1A may be connected to each other, and cathodes of the plurality of second light-emitting cells 111_2A may be connected to each other. The number of first pads PAD1A connected to the plurality of first light-emitting cells 111_1A may be less than twice the number of first light-emitting cells 111_1A. The number of second pads PAD2A connected to the plurality of second light-emitting cells 111_2A may be less than twice the number of second light-emitting cells 111_2A.

A first controller may be electrically connected to the plurality of first pads PAD1A. The first controller may adjust voltages applied to two different pads, from among the plurality of first pads PAD1A, and drive one light-emitting cell of which a cathode and an anode are respectively connected to the two pads. A second controller may adjust voltages applied to two different pads, from among the plurality of second pads PAD2A, and drive one light-emitting cell of which a cathode and an anode are respectively connected to the two pads.

Referring to FIG. 11, a first cell block BLK1A' may further include a plurality of first light-emitting cells 111_1A and a dummy light-emitting cell 111_1A', each of which is implemented as an LED. The dummy light-emitting cell 111_1A' may not be connected to a plurality of first pads PAD1A and may not substantially operate. In an example embodiment, the number of first light-emitting cells 111_1A and the dummy light-emitting cell 111_1A' included in the first cell block BLK1A' may be equal to the number of second light-emitting cells 111_2A included in the second cell block BLK2.

Figure 12:
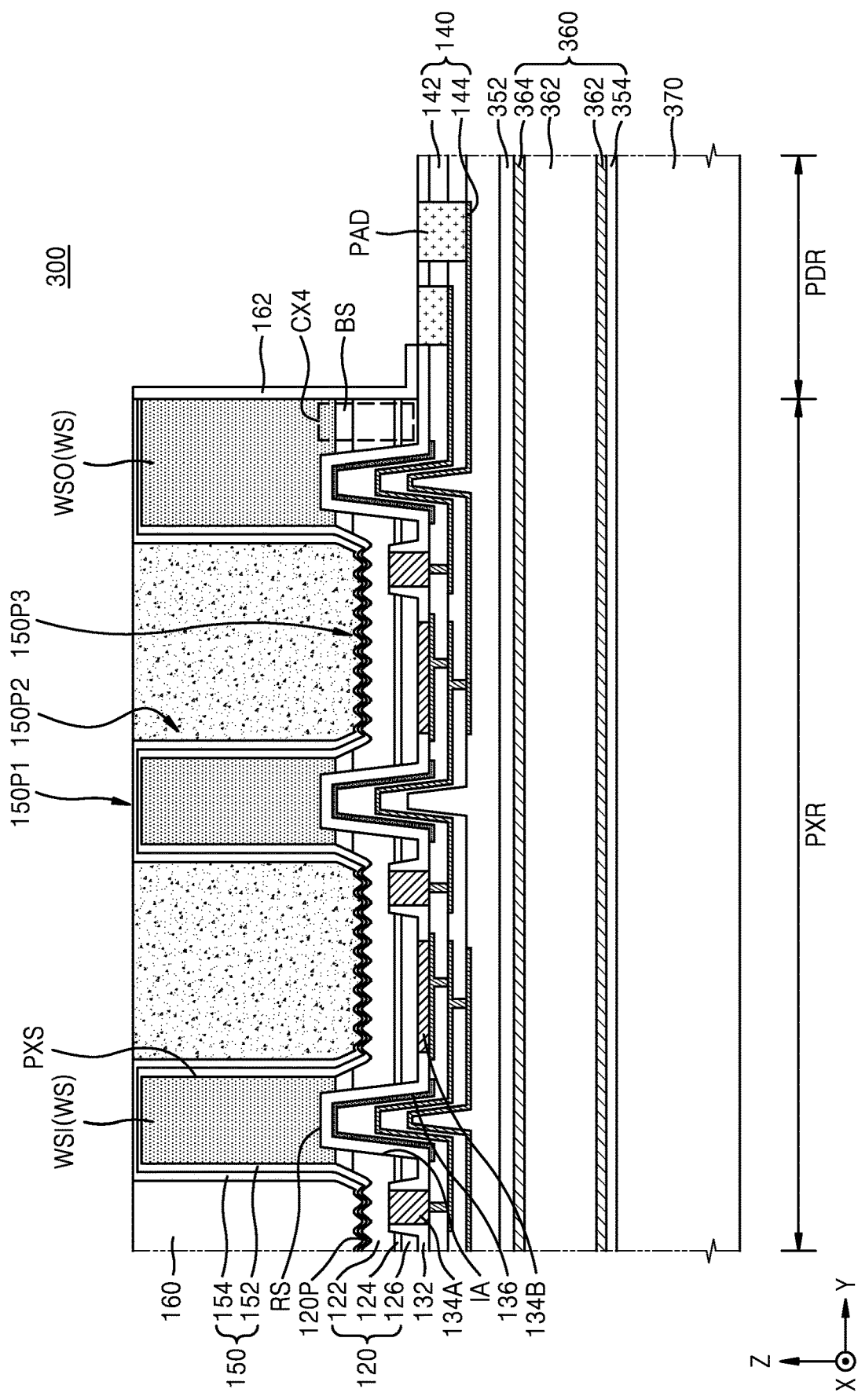
FIGS. 12 and 13 are diagrams of light-emitting devices according to example embodiments.
Figure 13:
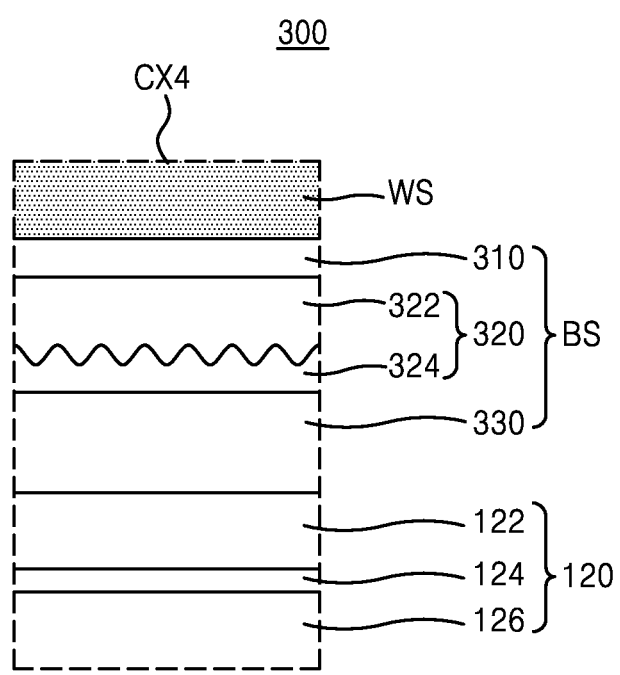

FIG. 12 is a cross-sectional view of a light-emitting device 300 according to example embodiments. FIG. 13 is an enlarged view of region CX4 of FIG. 12. FIG. 12 is an enlarged cross-sectional view of some components of the light-emitting device 300 adhered onto a printed circuit board 370, which is taken along line II-II' of FIG. 7, according to an example embodiment. In the descriptions of FIGS. 12 and 13, repeated descriptions of the same reference numerals as given with respect to FIGS. 8 and 9 are omitted.

Referring to FIGS. 12 and 1, the light-emitting device 300 may further include a buffer structure BS provided between a first conductive semiconductor layer 122 and a partition wall structure WS. The buffer structure BS may include a nucleation layer 310, a dislocation-removing structure 320, and a buffer layer 330, which are sequentially arranged on a bottom surfaces of the partition wall structure WS toward the first conductive semiconductor layer 122. The dislocation-removing structure 320 may include a first dislocation-removing material layer 322 and a second dislocation-removing material layer 324.

In example embodiments, the nucleation layer 310 may be a layer for forming nuclei for crystal growth or assisting the wetting of the dislocation-removing structures 320. For example, the nucleation layer 310 may include aluminum nitride (AlN). The first dislocation-removing material layer 322 may include $B_xAl_yIn_zGa_{1-x-y-z}N$ (where $0 \le x < 1$, $0 < y < 1$, $0 \le z < 1$, and $0 \le x+y+z < 1$). In some example embodiments, an aluminum (Al) content of the first dislocation-removing material layer 322 may be about 25 atomic percent (at %) to about 75 at %. The second dislocation-removing material layer 324 may have a different lattice constant from the first dislocation-removing material layer 322 and include, for example, aluminum nitride (AlN). At an interface between the first and second dislocation-removing material layers 322 and 324, a dislocation may be bent or a dislocation half-loop may be formed due to a difference in lattice constant between the first and second dislocation-removing material layers 322 and 324 to reduce the dislocation. A thickness of the second dislocation-removing material layer 324 may be less than a thickness of the nucleation layer 310. Thus, tensile stress generated in the second dislocation-removing material layer 324 may be reduced to prevent cracks from occurring.

The buffer layer 330 may reduce differences in lattice constant and coefficient of thermal expansion (CTE) between a layer (e.g., the first conductive semiconductor layer 122) formed on the buffer structure BS and the second dislocation-removing material layer 324. For example, the buffer layer 330 may include $B_xAl_yIn_zGa_{1-x-y-z}N$ (where $0 \le x < 1$, $0 < y < 1$, $0 \le z < 1$, and $0 \le x+y+z < 1$).

According to example embodiments, the buffer structure BS may not only prevent cracks from occurring in a plurality of light-emitting structures 120 but also prevent the propagation of dislocations into the plurality of light-emitting structures 120. Thus, the crystal quality of the light-emitting structures 120 may be improved.

In example embodiments, a wiring structure 140 may be arranged over a top surface of a support structure 360 with a first adhesive layer 352 therebetween, and a printed circuit board (PCB) 370 may be arranged on a bottom surface of the support structure 360 with a second adhesive layer 354 therebetween. The support structure 360 may include a support substrate 362, a first insulating layer 364, and a second insulating layer 366. The first insulating layer 364 may be in contact with the first adhesive layer 352, and the second insulating layer 366 may be in contact with the second adhesive layer 354.

The support substrate 362 may include an insulating substrate or a conductive substrate. The support substrate 362 may have an electric resistance of at least several MΩ, for example, at least 50 MΩ. For example, the support substrate 362 may include doped silicon, undoped silicon, $Al_2O_3$, tungsten (W), copper (Cu), a bismaleimide triazine (BT) resin, an epoxy resin, polyimide, a liquid crystal (LC)

polymer, a copper clad laminate, or a combination thereof. The support substrate 362 may have a thickness of at least 150 µm (e.g., about 200 µm to about 400 µm) in a vertical direction (i.e., a Z direction).

Each of the first insulating layer 364 and the second insulating layer 366 may have an electric resistance of at least several tens of MΩ, for example, at least 50 MΩ. For instance, each of the first insulating layer 364 and the second insulating layer 366 may include at least one of $SiO_2$, $Si_3N_4$, $Al_2O_3$, $HfSiO_4$, $Y_2O_3$, $ZrSiO_4$, $HfO_2$, $ZrO_2$, $Ta_2O_5$, and $La_2O_3$.

According to example embodiments, because the support structure 360 has a relatively high electric resistance, the occurrence of failures due to the formation of an undesired conduction path from the wiring structure 140 through the support structure 360 to the PCB 370 in a vertical direction may be prevented.

Figure 14:
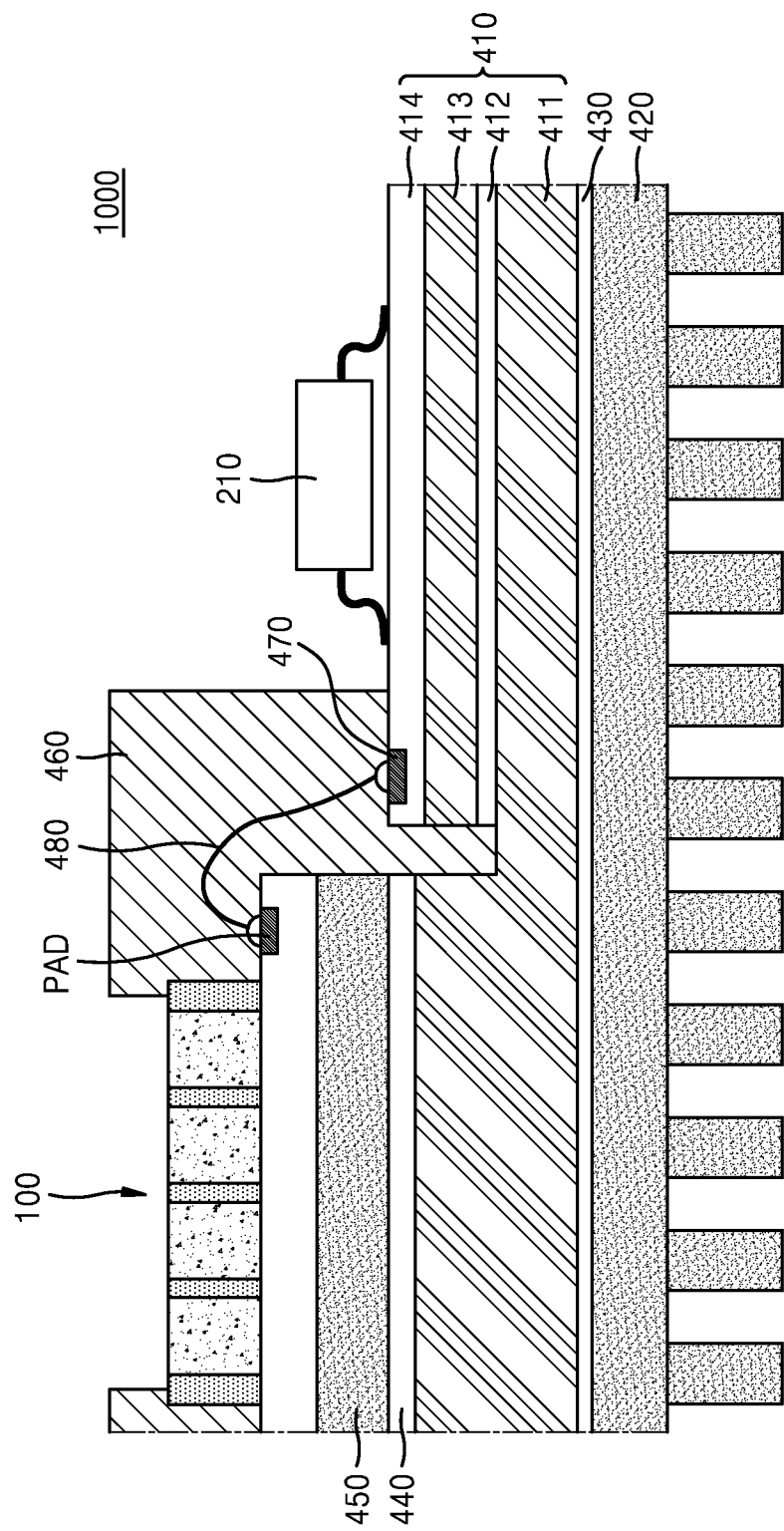
FIGS. 14 and 15 are cross-sectional views of light source modules, according to example embodiments.

FIG. 14 is a cross-sectional view of a light-emitting package 1000 including a light-emitting device 100, according to an example embodiment. In FIG. 14, the same reference numerals are used to denote the same elements as in FIGS. 1 to 13.

Referring to FIG. 14, the light-emitting package 1000 may include the light-emitting device 100 and a semiconductor driving chip 210, which are mounted on a package substrate 410. The semiconductor driving chip 210 may be one of the first to ninth controllers 210_1 to 210_9 of FIG. 2, and the package substrate 410 may be a printed circuit board PCB of FIG. 2.

A lower insulating layer 412, an inner conductive pattern layer 413, and an upper insulating layer 414 may be sequentially stacked on a partial region of a base plate 411, and at least one driver semiconductor chip 210 may be mounted on a conductive pattern positioned on the upper insulating layer 414.

An interposer 450 may be on another region of the base plate 411 with an adhesive layer 440 therebetween, and the light-emitting device 100 may be mounted on the interposer 450. In example embodiments, the interposer 450 may be the same as the support substrate (refer to 170 in FIG. 8) included in the light-emitting device 100, but is not limited thereto. The at least one semiconductor driving chip 210 may be electrically connected to a pad PAD of the light-emitting device 100 through a bonding wire 480 connected to a pad 470. The at least one semiconductor driving chip 210 may individually or entirely drive a plurality of light-emitting cells of the light-emitting device 100.

The bonding wire 480 may be encapsulated by a molding resin 460. The molding resin 460 may include, for example, an epoxy molding compound (EMC), but is not specifically limited. The molding resin 460 may partially encapsulate the light-emitting device 100 so as not to interfere with light emitted from the plurality of light-emitting cells of the light-emitting device 100.

A heat sink 420 may be adhered onto a bottom surface of the base plate 411, and a TIM layer 430 may be selectively further positioned between the heat sink 420 and base plate 411.

The light-emitting devices and/or the light source module described with reference to FIGS. 1 to 13 may be mounted alone or in combination in the light-emitting package 1000.

Figure 15:
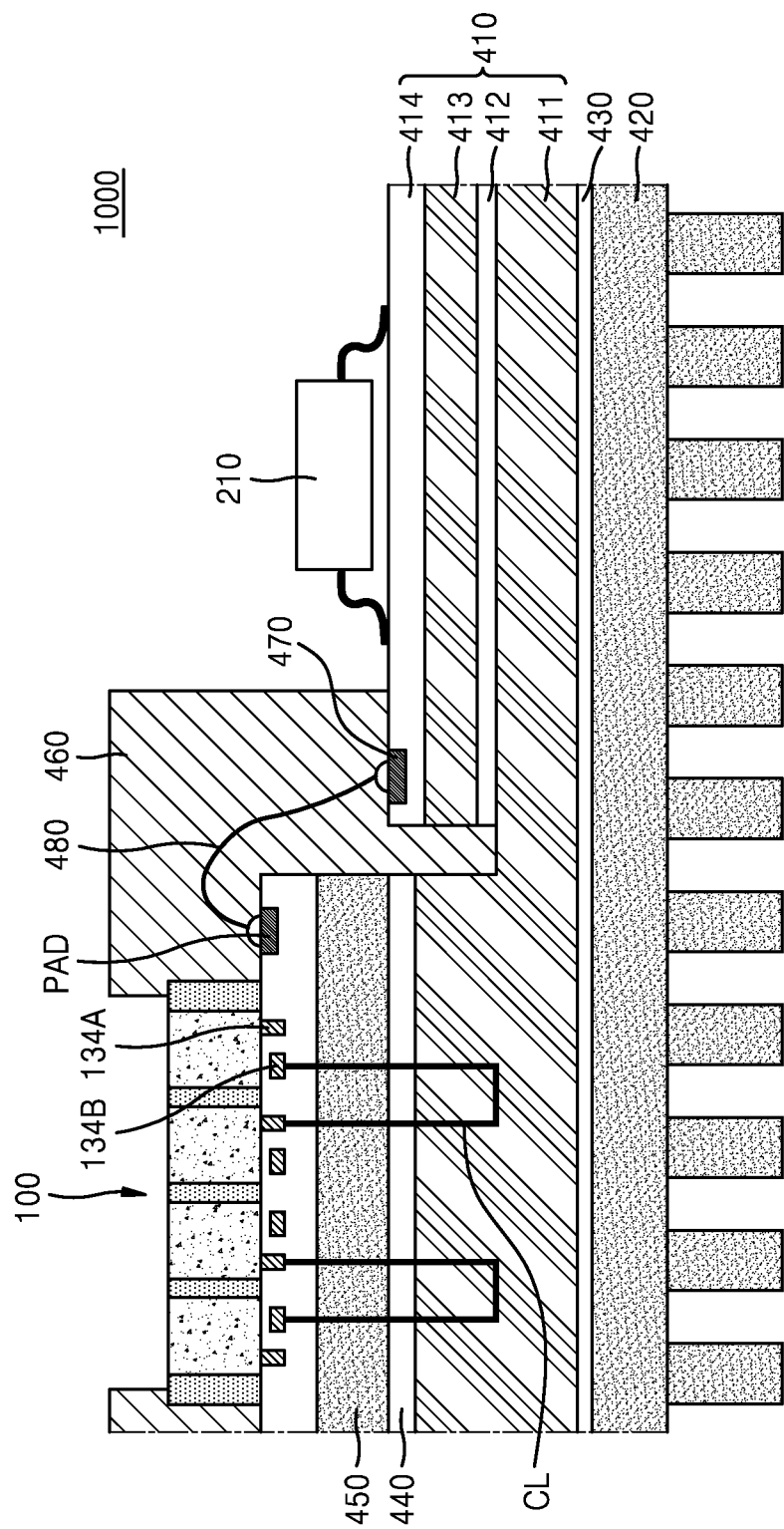

FIG. 15 is a cross-sectional view of a light-emitting package 1000A including a light-emitting device 100A, according to an example embodiment.

Referring to FIG. 15, a conductive line CL may electrically connect a first contact 134A of one light-emitting structure (e.g. light-emitting structure 120 of the FIGS. 8, 9, 12) to a second contact 134B of another light-emitting structure 120 connected in series to a specific light-emitting structure so that a plurality of light-emitting cells included in one cell block are connected in series to each other. Alternatively, in an example embodiment, the conductive line CL may electrically connect the first contact 134A of one light-emitting structure 120 to the first contact 134A of another light-emitting structure 120 connected in parallel to the one light-emitting structure 120 so that a plurality of light-emitting cells included in one cell block are connected in parallel to each other.

The conductive line CL may not be formed only in the light-emitting device 100A. For example, the conductive line CL may include a conductive pattern formed in a package substrate 410. The conductive line CL may include a conductive pattern formed in an interposer 450.

In an example embodiment, the light-emitting device 100A may not include a plurality of pads, which are formed on an emission surface (e.g., a surface formed in a third direction (Z)). The light-emitting device 100A may be connected to a semiconductor driving chip 210 through the conductive line CL formed in the package substrate 410.

Figure 16:
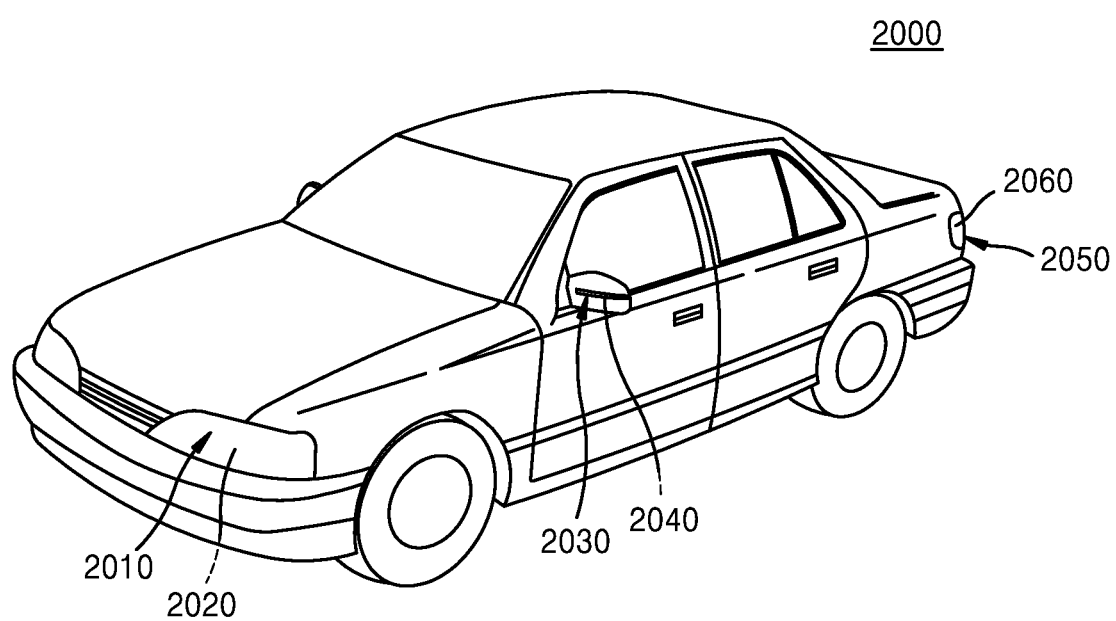
FIG. 16 is a schematic perspective view of a lighting apparatus including a light-emitting device, according to an example embodiment.

FIG. 16 is a schematic perspective view of a lighting apparatus including a light-emitting device, according to an example embodiment.

Referring to FIG. 16, a headlamp module 2020 may be installed in a headlamp unit 2010 of a vehicle. A side mirror lamp module 2040 may be installed in an outer side mirror unit 2030, and a tail lamp module 2060 may be installed in a tail lamp unit 2050. At least one of the headlamp module 2020, the side mirror lamp module 2040, and the tail lamp module 2060 may include one of the light source modules 10 and 10A, which includes at least one of the light-emitting devices 100 and 100A described above.

Figure 17:
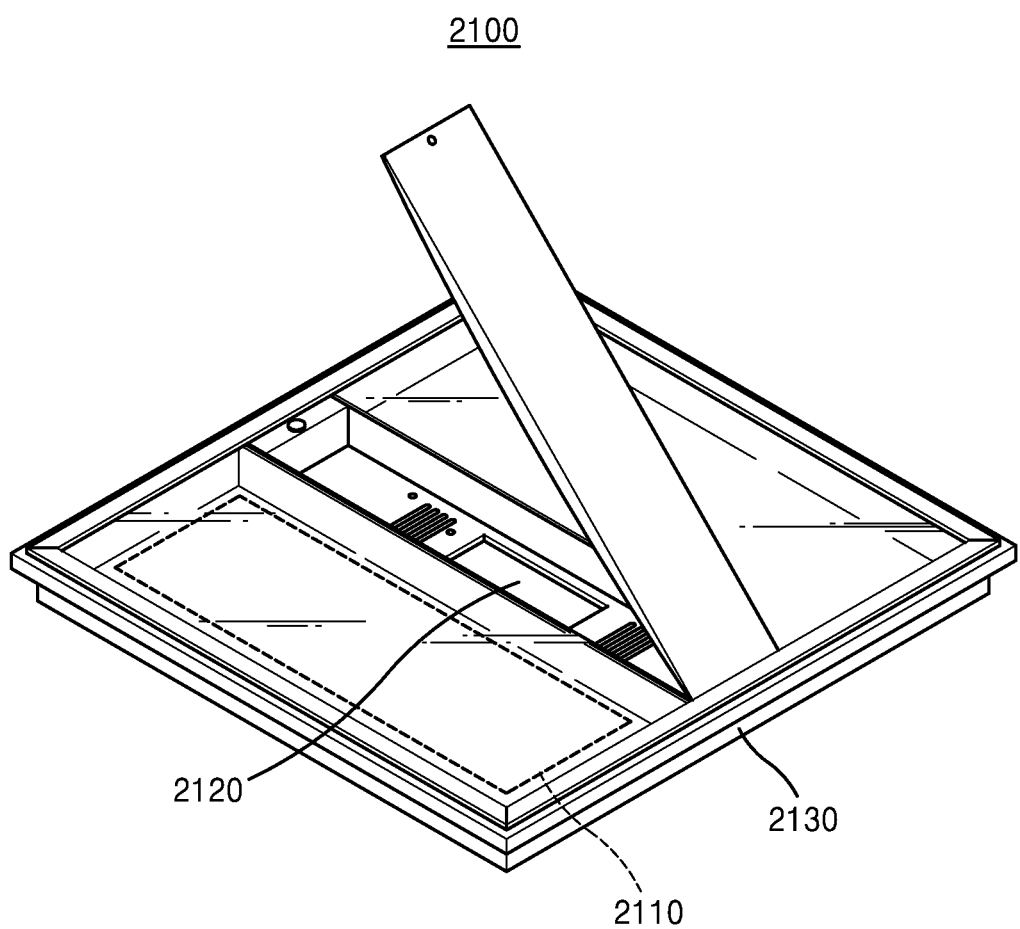
FIG. 17 is a schematic perspective view of a flat-panel lighting apparatus including a light-emitting device, according to an example embodiment.

FIG. 17 is a schematic perspective view of a flat-panel lighting apparatus 2100 including a light-emitting device, according to an example embodiment.

Referring to FIG. 17, the flat-panel lighting apparatus 2100 may include a light source module 2110, a power supply 2120, and a housing 2130.

The light source module 2110 may include a light-emitting device array as a light source. The light source module 2110 may be one of the light source modules 10 and 10A, which includes, as a light source, at least one of the light-emitting devices 100 and 100A described above. The light source module 2110 may have a flat shape as a whole.

The power supply 2120 may be configured to supply power to the light source module 2110. The housing 2130 may form an accommodation space for accommodating the light source module 2110 and the power supply 2120. The housing 2130 may be formed to have a hexahedral shape with one opened side, but is not limited thereto. The light source module 2110 may be positioned to emit light toward the opened side of the housing 2130.

Figure 18:
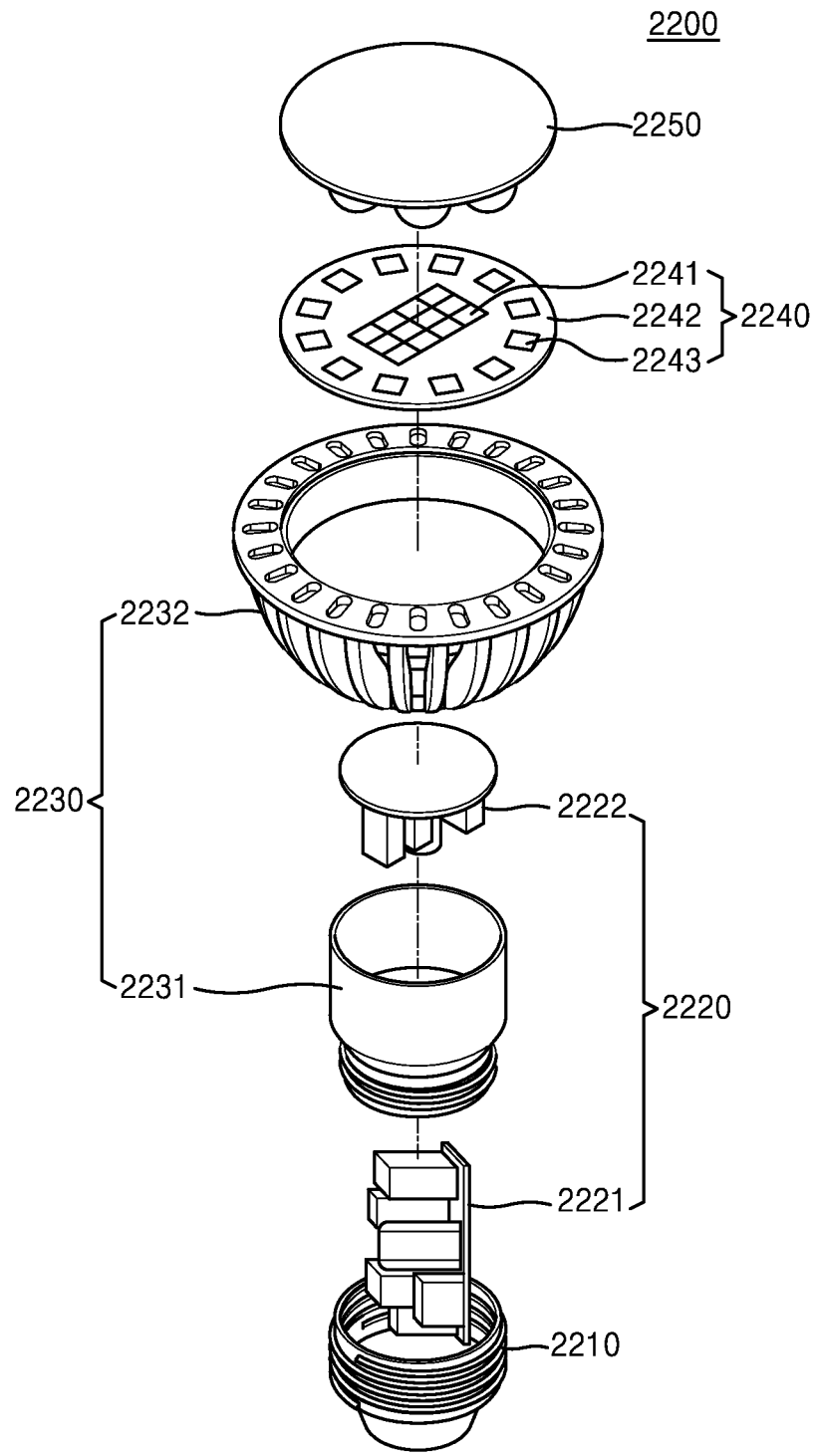
FIG. 18 is an exploded perspective view of a lighting apparatus including a light-emitting device, according to an example embodiment.

FIG. 18 is an exploded perspective view of a lighting apparatus 2200 including a light-emitting device, according to an example embodiment.

Referring to FIG. 18, the lighting apparatus 2200 may include a socket 2210, a power supply 2220, a heat sink 2230, a light source module 2240, and an optical unit 2250.

The socket 2210 may be configured to be replaceable with an existing lighting apparatus. Power may be supplied to the lighting apparatus 2200 through the socket 2210. The power supply 2220 may be dissembled into a first power supply 2221 and a second power supply 2222. The heat sink 2230 may include an internal heat sink 2231 and an external heat sink 2232. The internal heat sink 2231 may be directly connected to the light source module 2240 and/or the power supply 2220 and transmit heat to the external heat sink 2232 through the light source module 2240 and/or the power supply 2220. The optical unit 2250 may include an internal optical unit and an external optical unit. The optical unit 2250 may be configured to uniformly disperse light emitted by the light source module 2240.

The light source module 2240 may receive power from the power supply 2220 and emit light to the optical unit 2250. The light source module 2240 may include at least one light-emitting element package 2241, a circuit board 2242, and a controller 2243. The controller 2243 may store driving information of the light-emitting device packages 2241. The light-emitting device package 2241 may include at least one of the light-emitting devices 100 and 100A described above, and the light source module 2240 may be one of the light source modules 10 and 10A described above.

While example embodiments have been particularly shown and described, it will be understood that various changes in form and details may be made therein without departing from the spirit and scope of the following claims.

What is claimed is:

1. A light source module comprising:
   a printed circuit board;
   a light-emitting device mounted on the printed circuit board, the light-emitting device comprising a plurality of cell blocks, each of which comprises a plurality of light-emitting diodes (LEDs); and
   a plurality of controllers mounted on the printed circuit board, each of which is configured to drive a cell block corresponding thereto, from among the plurality of cell blocks,
   wherein the plurality of cell blocks are electrically isolated from each other,
   wherein the plurality of cell blocks comprise a first cell block and a second cell block,
   wherein a number of first LEDs included in the first cell block is less than a number of second LEDs included in the second cell block,
   wherein the plurality of cell blocks and the plurality of controllers are provided on a same side of the printed circuit board,
   wherein the first LEDs are connected in series to each other and are configured to emit light of a same color,
   wherein the second LEDs are connected in series to each other and are configured to emit light of a same color,
   wherein the plurality of controllers comprise a first controller connected to a plurality of first channels and a second controller connected to a plurality of second channels which are different from the plurality of first channels,
   wherein one of the plurality of first channels is connected between two of the first LEDs,
   wherein one of the plurality of second channels is connected between two of the second LEDs,
   wherein the first controller is configured to drive the first cell block through the plurality of first channels, and
   wherein the second controller is configured to drive the second cell block through the plurality of second channels.

2. The light source module of claim 1, wherein a number of the plurality of first channels connected to the first controller is less than a number of the plurality of second channels connected to the second controller.

3. The light source module of claim 1, wherein the light-emitting device is disposed in a central area of the printed circuit board between the first controller and the second controller, and
   wherein the plurality of controllers are disposed in a peripheral area of the printed circuit board surrounding the central area.

4. The light source module of claim 1, wherein the first LEDs are electrically connected to each other in series through conductive lines formed on the printed circuit board.

5. The light source module of claim 1, wherein the plurality of cell blocks are arranged in a first row and a second row,
   wherein the first row and the second row extend in parallel between the first controller and the second controller, and
   wherein the first cell block is arranged on an end of the first row.

6. The light source module of claim 1, wherein the plurality of cell blocks are arranged in a first row and a second row,
   wherein the first row and the second row extend in parallel between the first controller and the second controller, and
   wherein the first cell block is in a center of the second row.

7. The light source module of claim 6, wherein the first cell block comprises a smallest number of LEDs from among the plurality of cell blocks.

8. The light source module of claim 1, wherein the one of the plurality of first channels is connected between an anode of one of the first LEDs and a cathode of another one of the first LEDs.

9. The light-emitting device of claim 1, wherein the LEDs in each of the plurality of cell blocks are arranged in a matrix.

10. The light source module of claim 9, wherein the first cell block is adjacent the second cell block.

11. A light-emitting device comprising:
    a plurality of cell blocks electrically isolated from each other, each of which comprises a plurality of light-emitting diodes (LEDs) and is provided on a printed circuit board;
    a plurality of controllers, each of which is configured to drive a cell block corresponding thereto, from among the plurality of cell blocks, and is provided on the printed circuit board; and
    a plurality of pads configured to electrically connect the plurality of cell blocks to an external device,
    wherein the plurality of cell blocks comprise a first cell block and a second cell block,
    wherein a number of first LEDs included in the first cell block is less than a number of second LEDs included in the second cell block,
    wherein the first LEDs are connected in series to each other and are configured to emit light of a first color,
    wherein the second LEDs are connected in series to each other and are configured to emit light of a second color,
    wherein the plurality of controllers comprise a first controller connected to a plurality of first channels and a second controller connected to a plurality of second channels which are different from the plurality of first channels,
    wherein one of the plurality of first channels is connected between two of the first LEDs,
    wherein one of the plurality of second channels is connected between two of the second LEDs, wherein the first controller is configured to drive the first cell block through the plurality of first channels, wherein the second controller is configured to drive the second cell block through the plurality of second channels, and wherein the plurality of cell blocks and the plurality of pads are provided on a same side of the printed circuit board.

12. The light-emitting device of claim 11, wherein the first LEDs further comprise a dummy LED electrically isolated from the plurality of pads.

13. The light-emitting device of claim 11, wherein the plurality of cell blocks are arranged in a first row and a second row, wherein the first row and the second row extend in parallel between the first controller and the second controller, and wherein a total number of LEDs included in cell blocks arranged in the first row is less than a total number of LEDs included in cell blocks arranged in the second row.

14. The light-emitting device of claim 11, wherein the plurality of cell blocks are arranged in a first row and a second row, wherein the first row and the second row extend in parallel between the first controller and the second controller, and wherein the first cell block is arranged on one end of the first row.

15. The light-emitting device of claim 11, wherein the plurality of cell blocks are arranged in a first row and a second row, wherein the first row and the second row extend in parallel between the first controller and the second controller, and wherein the first cell block is in a center of the second row.

16. The light-emitting device of claim 11, wherein the plurality of cell blocks are disposed in a central area of the light-emitting device between the first controller and the second controller, and wherein the plurality of pads are disposed in a peripheral area of the light-emitting device surrounding the central area.

17. A light source module comprising:

a printed circuit board;

a light-emitting device mounted on the printed circuit board, the light-emitting device comprising a plurality of cell blocks, each of which comprises a plurality of light-emitting diodes (LEDs); and a plurality of controllers mounted on the printed circuit board, each of which is configured to drive a cell block corresponding thereto, from among the plurality of cell blocks, wherein the plurality of cell blocks and the plurality of controllers are provided on a same side of the printed circuit board, wherein the plurality of cell blocks are electrically isolated from each other, wherein the plurality of cell blocks comprise a first cell block and a second cell block, wherein the plurality of cell blocks are arranged in a first row and a second row, and a number of LEDs included in cell blocks arranged in the first row is less than a number of LEDs included in cell blocks arranged in the second row, wherein first LEDs provided in the first cell block are connected in series to each other and are configured to emit light, wherein second LEDs provided in the second cell block are connected in series to each other and are configured to emit light, wherein the plurality of controllers comprise a first controller connected to a plurality of first channels and a second controller connected to a plurality of second channels which are different from the plurality of first channels, wherein the first controller is configured to drive the first cell block through the plurality of first channels and one of the plurality of first channels is connected between two of the first LEDs, and wherein the second controller is configured to drive the second cell block through the plurality of second channels and one of the plurality of second channels is connected between two of the second LEDs.

18. The light source module of claim 17, wherein two cell blocks arranged on two ends of the first row comprise a smaller number of LEDs than other cell blocks positioned adjacent thereto.

19. The light source module of claim 17, wherein a cell block arranged in a center of the second row comprises a smaller number of LEDs than other cell blocks positioned adjacent thereto.

20. The light source module of claim 17, wherein the plurality of LEDs included in one cell block, from among the plurality of cell blocks, are electrically connected to each other in series through conductive lines formed on the printed circuit board.

* * * * *